United States Patent
Tanzawa et al.

(10) Patent No.: US 6,801,457 B2
(45) Date of Patent: Oct. 5, 2004

(54) NON-VOLATILE SEMICONDUCTOR MEMORY

(75) Inventors: Toru Tanzawa, Ebina (JP); Shigeru Atsumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/665,014

(22) Filed: Sep. 22, 2003

(65) Prior Publication Data

US 2004/0062111 A1 Apr. 1, 2004

Related U.S. Application Data

(62) Division of application No. 09/953,227, filed on Sep. 17, 2001, now Pat. No. 6,650,570.

(30) Foreign Application Priority Data

Sep. 22, 2000 (JP) ........................................ 2000-288330

(51) Int. Cl.$^7$ .............................................. G11C 16/04
(52) U.S. Cl. ............................ 365/185.22; 365/185.03; 365/185.2
(58) Field of Search ....................... 365/185.22, 185.03, 365/185.09, 185.2, 185.24, 185.29

(56) References Cited

U.S. PATENT DOCUMENTS

| | | | |
|---|---|---|---|
| 5,570,315 A | | 10/1996 | Tanaka et al. |
| 5,652,719 A | | 7/1997 | Tanaka et al. |
| 6,058,060 A | * | 5/2000 | Wong .......................... 365/218 |
| 6,707,719 B2 | * | 3/2004 | Shibata et al. .......... 365/185.22 |

OTHER PUBLICATIONS

M. Bauer, et al., "A Multilevel–cell 32Mb Flash Memory" 1995 IEEE International Solid–State Circuits Conference, pp. 132–133.
M. Ohkawa, et al., "A 98mm$^2$ 3.3V 64Mb Flash Memory with FN–NOR Type 4–level Cell" 1996 IEEE International Solid–State Circuits Conference, pp. 36–37.
G. Campardo, et al. "A 40mm$^2$ 3V 50MHz 64Mb 4–Level Cell NOR–Type Flash Memory", 2000 IEEE International Solid–State Circuits Conference, p. 274.

\* cited by examiner

Primary Examiner—Vu A. Le
(74) Attorney, Agent, or Firm—Banner & Witcoff, Ltd.

(57) ABSTRACT

A non-volatile semiconductor memory comprises a memory cell array having a plurality of non-volatile memory cells, at least one reference cell, a read circuit for reading data by applying a first voltage to one of word lines to compare a current flowing through one of bit lines with a current flowing through the reference cell, an erase circuit for erasing the data by applying a voltage to at least two selected from the word lines, the bit lines, the source lines and a semiconductor region including the memory cells, first and second regulators, and an erase verify circuit for detecting whether the erase has finished by applying an output voltage of the first regulator to word lines of the memory cells to be erased, while applying an output voltage of the second regulator to a word line of the reference cell, thereby comparing a cell current of selected one of the memory cells with a cell current of the reference cell.

4 Claims, 21 Drawing Sheets

WL=0v
Col=0v
Coltrim=5v
Trim=0v
Vddp=5v
|       | s1 | s2 | s3 | refWL | refcolR | rcw1 | rcw2 | rcw3 | out1   out2   out3 |
|-------|----|----|----|-------|---------|------|------|------|--------------------|
| Step1 | Erase reference cells ||||||||                                          |
| Step2 | 0v | 5v | 5v | 5v    | 5v      | 0v   | 0v   | 0v   | out1:L→step3/H→step4 |
| Step3 | 0v | 5v | 5v | 9v    | 0v      | 9v   | 0v   | 0v   | →step2              |
| Step4 | 5v | 0v | 5v | 5v    | 5v      | 0v   | 0v   | 0v   | out2:L→step5/H→step6 |
| Step5 | 5v | 0v | 5v | 9v    | 0v      | 0v   | 9v   | 0v   | →step4              |
| Step6 | 5v | 5v | 0v | 5v    | 5v      | 0v   | 0v   | 0v   | out3:L→step7/H→step8 |
| Step7 | 5v | 5v | 0v | 9v    | 0v      | 0v   | 0v   | 9v   | →>step8             |
| Step8 | Trim end ||||||||                                                       |
F I G. 14
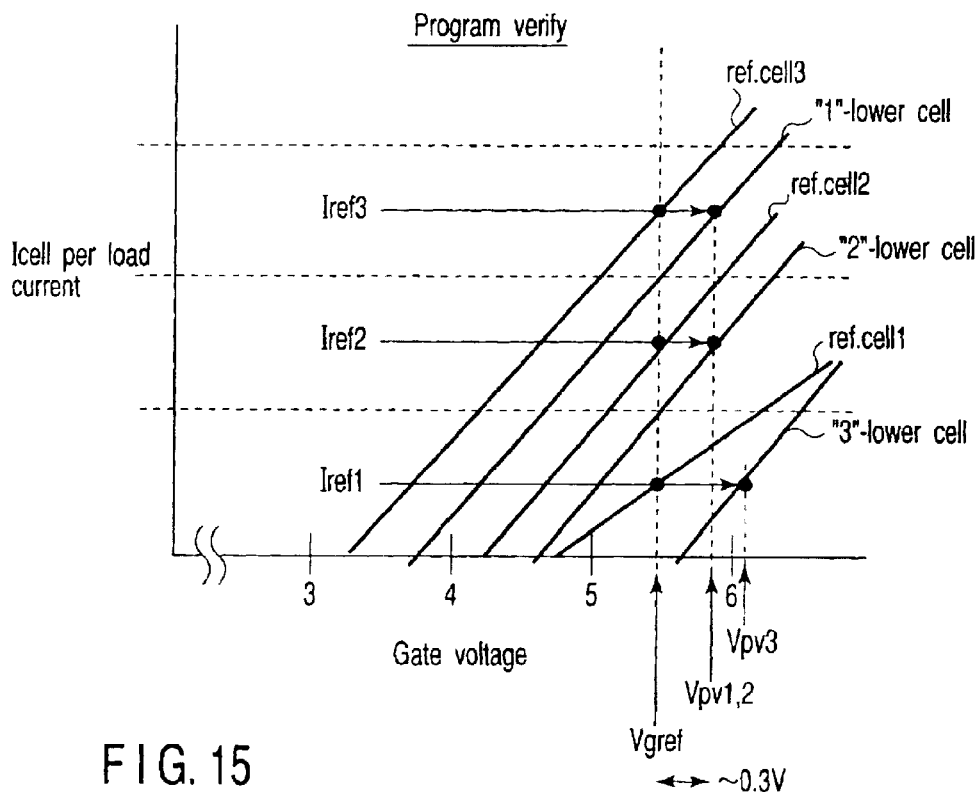
F I G. 15

NON-VOLATILE SEMICONDUCTOR MEMORY

CROSS-REFERENCE TO RELATED APPLICATIONS

This application is a divisional of prior U.S. application Ser. No. 09/953,227, filed Sep. 17, 2001 now U.S. Pat. No. 6,650,570, which is based upon and claims the benefit of priority from the prior Japanese Patent Application No. 2000-288330, filed Sep. 22, 2000, the entire contents of which are incorporated herein by reference.

BACKGROUND OF THE INVENTION

1. Field of the Invention

The present invention relates to a non-volatile semiconductor memory, and more particularly to a Flash memory with multi-level cells used for 2-level/4-level switchable Flash memory.

2. Description of the Related Art

Flash memories with two levels (hereinafter denoted by 2-level data) have been widely used. However, when Flash memories with three or more levels (multi-level), for example, 4-level (hereinafter denoted by 4-level data) are produced, characteristics of reference cells and increase of an area of sense amplifiers will become serious problems. These problems will be described below.

FIG. 23 shows two threshold voltage distributions of a Flash memory which includes an array of memory cells (2-level cells) capable of storing 2-level data "0" and "1".

FIG. 24 also shows four threshold voltage distributions of a Flash memory which includes an array of memory cells (4-level cells) capable of storing 4-level data "0", "1", "2" and "3". This has been already disclosed in M. Bauer et al., "A multi-level cell 32 Mb Flash memory," ISSCC digest of technical papers, pp. 132–3, 1995.

It will be understood from FIGS. 23 and 24 that the distribution width and interval of the threshold voltages must be tight in the 4-level cells as compared with the 2-level cells.

FIG. 25 shows a relation between agate voltage Vg and a drain current Id (cell current per unit load current) in both memory cells and reference cells of 2-level cell Flash memory.

In the Vg-Id characteristics of the memory cells, data "1" are given when the number of electrons stored in a floating gate is comparatively large, namely, the threshold voltage Vth is high, and data "0" are given when the number of electrons thereof is comparatively small, namely, the threshold voltage Vth is low. That is, the memory cells storing data "1" are denoted by cells "1", while the memory cells storing data "0" are denoted by cells "0".

The cell current Iref flowing through the reference cell is approximately half as compared with the cell current Icell of the memory cell. That is, the current Iref of the reference cell is set so as to have approximately half of the cell current cell of the memory cell. Accordingly, the difference between the cell currents Icell and Iref is approximately equal in "0" and "1" when the gate voltage is equal to a read voltage. The current difference is converted into a voltage difference, thereby reading out cell data by a sense amplifier for providing digital signals of "0"/"1".

FIG. 26 represents Vg-Id characteristics of the memory cells in 4-level Flash memories, which shows portions corresponding to a part ("0", "1", "2") of 4-level data "0", "1", "2", and "3".

In FIG. 26, twelve characteristics show those of upper and lower limits in respective distributions of data "0", "1" and "2" for every two characteristics in the case of high and low temperatures. It will be apparent that the temperature dependence of the Vg-Id characteristics of the cell current Icell is considerably high.

If the characteristics of 2-level reference cell are applied to those of 4-level reference cell as it is, the temperature change in Iref will become half of that in Icell, because Icell is about half of Icell as described above.

Icell have the highest temperature change in the case where it corresponds to "0", while having the lowest temperature change in the case where it corresponds to "3", (not shown). This means that the characteristics of conventional 2-level reference cells are applied in the case of "3" as it is, but that those of 2-level reference cells are not applied in the case of "0", "1" and "2", respectively.

Since three sense amplifiers are required in order to enable that 4-level cells are readout in the memories for reading 2-level cells as disclosed in C. Calligaro et al., "Comparative analysis of sensing schemes for multilevel non-volatile memories," Proceedings of Second Annual IEEE International conference on innovative systems in silicon, pp 266–73, 1997, the area of the memories will be increased as compared with that of 2-level cell memories.

In the conventional non-volatile memories, as described above, when the characteristics of 2-level reference cells are applied in the case of 4-level cells as it is, the conventional technique can be applied to data "3", but can not be applied to data "0", "1" and "2", respectively. Further, when the memory cells are provided to have a switchable mode of 2-level mode/4-level mode, thereby reading out the 4-level mode, the area of the sense amplifiers will be increased as compared with the case for reading out the 2-level cells.

BRIEF SUMMARY OF THE INVENTION

According to a first aspect of the present invention, there is provided a non-volatile semiconductor memory which comprises a memory cell array having a plurality of non-volatile memory cells;

word lines, bit lines and source lines connected to the memory cells;

a row decoder for selecting one of the word lines;

a column decoder for selecting one of the bit lines;

at least one reference cell;

a read circuit for reading data by applying a first voltage to one of the word lines to compare a current flowing through one of the bit lines with a current flowing through the reference cell;

an erase circuit for erasing the data by applying a voltage to at least two selected from the word lines, the bit lines, the source lines and a semiconductor region including the memory cells;

first and second regulators; and an erase verify circuit for detecting whether the erase has finished by applying an output voltage of the first regulator to word lines of the memory cells to be erased, while applying an output voltage of the second regulator to a word line of the reference cell, thereby comparing a cell current of selected one of the memory cells with a cell current of the reference cell.

According to a second aspect of the present invention, there is provided a non-volatile semiconductor memory which comprises a memory cell array having a plurality of non-volatile memory cells;

word lines, bit lines and source lines connected to the memory cells;

a row decoder for selecting one of the word lines;

a column decoder for selecting one of the bit lines;

at least one reference cell;

a read circuit for reading data by applying a first voltage to one of the word lines to compare a current flowing through one of the bit lines with a current flowing through the reference cell;

a program circuit for programming the data by applying a voltage to at least two selected from the word lines, the bit lines, the source lines and a semiconductor region including the memory cells;

first and second regulators; and a program verify circuit for detecting whether programming has finished by applying an output voltage of the second regulator to word lines of the memory cells to be programmed, while applying an output voltage of the second regulator to a word line of the reference cell, thereby comparing a cell current of selected one of the memory cells with a cell current of the reference cell.

According to the first and second non-volatile semiconductor memories, a word line voltage control circuit for controlling a word line voltage Vwl of the memory cells can be basically provided with the same structure as a reference word line voltage control circuit for controlling a word line voltage Vwlref of the reference cell. Therefore, even if the reference voltage is varied, variation in the difference between Vwlref and Vwl can be controlled because Vwlref is linked to Vwl.

Further, similar advantage may also be obtained by producing the word line voltages for both memory cells and reference cell at the program-erase-program verify-erase verify from two regulators and by applying another voltage VDDR to these word lines during the read.

According to a third aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

first and second reference cells;

first, second and third load current sources;

a first load circuit for providing a first voltage output from both a first load current and a current flowing through one of the bit lines by applying a first word line voltage to one of the word lines;

a second load circuit for providing a second voltage output from both a second load current and a current flowing through one of the bit lines by applying the first word line voltage to a word line of the first reference cells;

a first read circuit for deciding whether the memory cells are at one of first and second levels by comparing the first voltage output with the second voltage output;

a third load circuit for providing a third voltage output from both a third load current and a current flowing through one of the bit lines by applying the first word line voltage to a word line of the second reference cell; and a second read circuit for deciding whether the memory cells are at one of second and third levels by comparing the second voltage output with the third voltage output;

wherein N1/N2 is larger than I1/I2 where N1 (N1≧1, positive integer) is the number of the first reference cell connected in parallel with one another, N2 (N2≧1, positive integer) is the number of the second reference cell connected in parallel with one another, I1 is the second load current and I2 is the third load current.

According to the third non-volatile memory, the stable read and verify can be executed for the temperature dependence of the cell current and for variation in the cell current by similarly setting the cell current of reference cells per load current to that of the memory cells.

Further, variation in the cell current for variation in the word line voltage can be controlled by increasing the load current of the reference cell having the highest threshold voltage more than the load current of the reference cell having the lowest threshold voltage.

Still further, a withstanding property for ground noise can be obtained by proportioning the number of data lines connected to load transistors at both the memory side and the reference side. In this case, the reference voltage is commonly input to all of the sense amplifiers.

According to a fourth aspect of the present invention, there is provided a non-volatile semiconductor memory which comprises a memory cell array having first and second non-volatile memory cells each having three or more threshold voltage levels;

word lines, bit lines and source lines connected to the memory cells;

a row decoder for selecting one of the word lines;

a column decoder for selecting one of the bit lines;

first to fourth reference cells;

first to sixth load current sources; and first to third comparators;

wherein when a first mode signal is a first logic, the first memory cell and the first load current source are provided as a first input of the first comparator, the second memory cell and the second load current source are provided as a first input of the second comparator, and the first reference cell and the third load current source are provided as a common second input of the first and second comparators, so that the third comparator is set to an inactivated condition, respectively, and wherein when the first mode signal is a second logic, one of the first and second memory cells is connected to one of the first and second load current sources, so that the connection node is provided as a first input of the first to third comparators, the second reference cell and the fourth load current source are provided as a second input of the first comparator, the third reference cell and the fifth load current source are provided as a second input of the second comparator, and the fifth reference cell and the sixth load current source are provided as a second input of the third comparator, respectively.

According to the fourth non-volatile semiconductor memory, a non-volatile memory switchable to multi-level and 2-level can be obtained by a command or program to ROM. Further, the number of the sense amplifiers can be minimized by switching with the multi-level mode or 2-level mode both a first switch for connecting a sense amplifier to a data line and a second switch for connecting a current load to the data line, respectively.

According to a fifth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

an input/output buffer with N bits to which program data is input to provide read data as an output;

an input register with M bits for latching program data input by a plurality of cycles;

a test data generator for producing test data with K bits from input data of the M bits;

a column redundancy replacement circuit for replacing defective columns of L bits in the memory cell array;

a page buffer for latching output data of (M+K+L) bits from the column redundancy replacement circuit to which data of (M+K) bits is input; and a program circuit for generating first or second program voltage whether data of the page buffer is non-program data.

According to a sixth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

a read circuit for reading (M+K+L)bit-data from the memory cells;

a column redundancy replacement circuit for replacing defective columns of L bits in the memory cell array;

an error correction circuit for providing output data of (M+K) bits from the column redundancy replacement circuit to which data of (M+K+L) bits is input;

an output register for latching input data of M bits; and an output buffer for providing M bits in the form of N bit-data by a plurality of cycles.

According to the fifth and sixth non-volatile semiconductor memories, the redundancy and error correction can be executed at the same time on the Flash memories because they include the input buffer for maintaining the programmed input data, the error correction circuit for generating test data for the error detection or correction from the input data, the redundancy replacement circuit for replacing the program data composed of the programmed input data and the test data, depending upon the column redundancy information, and the page buffer for latching the output from the redundancy replacement circuit.

Further, since the non-volatile semiconductor memories have the sense amplifiers for the verify and read, reading can be achieved from a block which is not an object of the program even if the program time becomes long by the multi-level state.

Still further, since the verify is executed with a plurality of cycles, the number of the sense amplifiers for the verify can be reduced as compared with the number of the sense amplifiers for the read, thereby suppressing the circuit area.

Furthermore, since the error correction is carried out after the data read out from the memory cells is replaced depending upon the redundancy information, the redundancy and the error correction are executed on the Flash memories at the same time.

According to a seventh aspect of the present invention, there is provided a non-volatile semiconductor memory which comprises a memory cell array having a plurality of non-volatile memory cells;

word lines, bit lines and source lines connected to the memory cells;

a row decoder for selecting one of the word lines;

a column decoder for selecting one of the bit lines;

at least one reference cell; and a comparator circuit for comparing a cell current of the reference cell with a cell current of selected one of memory cells;

wherein a first input of the comparator circuit is connected to the selected one of the memory cells when a first signal is a first logic, while the first input is connected to one of current sources selected from internal and external current sources when the first signal is a second logic; and wherein a threshold voltage of the reference cell is controlled while monitoring an output voltage of the comparator circuit when the first signal is the second logic.

According to the seventh non-volatile semiconductor memory, as one constant current source is employed as a cell side input of the sense amplifier, Vt adjustment of the reference cell can be carried out while monitoring the output of the sense amplifier. Therefore, Vt control with high accuracy can be executed at a short time.

According to an eighth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines; and a column decoder for selecting one of the bit lines;

wherein when the three threshold voltage levels are given by Vt1, Vt2 and Vt3 (Vt1<Vt2<Vt3), respectively, the following steps (1) to (5) are executed to carry out a program operation, (1) loading program data, (2) the program for the memory cells to be given by Vt2 being accomplished by a first gate voltage, (3) detecting whether the memory cells have Vt2, and carrying out the step (2) using a second gate voltage higher than the first gate voltage when they do not have Vt2, followed by a next step (4) when they have Vt2, (4) the program for the memory cells to be given by Vt3 being carried out by a value equal to or higher (a third gate voltage) than a maximum value of a program gate voltage of the memory cells to be given by Vt2, and (5) detecting whether the memory cells have Vt3, and re-executing the step (4) when they do not have Vt3, while finishing the program operation when they have Vt3.

According to a ninth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines; and a column decoder for selecting one of the bit lines;

wherein when the three threshold voltage levels are given by Vt1, Vt2 and Vt3 (Vt1<Vt2<Vt3), respectively, the following steps (1) to (5) are executed to carry out a program operation, (1) loading program data, (2) the program for the memory cells to be given by Vt3 being accomplished by a voltage value (a third gate voltage) equal to or higher than a maximum value of a program gate voltage of the memory cells to be given by Vt2, (3) detecting whether the memory cells have Vt3, and re-executing the step (2) when they do not have Vt2, followed by a next step (4) when they have Vt2, (4) the program for the memory cells to be given by Vt2 being carried out by a first gate voltage, and (5) detecting whether the memory cells have Vt2, and executing the step (4) using a second gate voltage higher than the first gate voltage when they do not have Vt2, while finishing the program operation when they have Vt2.

According to the eighth and ninth on-volatile memories, the program time can be reduced by dividing the program sequence into the first program of the highest level of Vt and the second program except it.

Further, at a first program verify for judging or detecting whether the memory cells have Vt2, the word line voltage of the selected memory cells is given as a first verify voltage, and the word line voltage of the reference cell is given by a second verify voltage which is lower than the first verify voltage. At a second program verify for judging whether the memory cells have Vt3, the word line voltage of the selected memory cells is given by a third verify voltage. Therefore, the word line voltage of the reference cell can be given as a second verify voltage.

According to a tenth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

an input/output buffer to which program data is input to provide read data;

an input register with M bits for latching program data to be input;

a column redundancy replacement circuit for replacing defective columns of L bits in the memory cell array;

a page buffer for latching output data of (M+L) bits from the column redundancy replacement circuit to which data of M bits is input; and a program circuit for generating one of first and second program voltages according to whether data of the page buffer is non-program data.

According to an eleventh aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

a read circuit for reading data of (M+L) bits from the memory cells;

a column redundancy replacement circuit for replacing defective columns of L bits in the memory cell array to provide M bits by the input of the data of (M+L) bits; and an output buffer for providing the data of M bits output from the column redundancy replacement circuit.

According to a twelfth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

at least one reference cell;

a read circuit for reading data of the memory cells by applying a first voltage to the word lines to compare a current flowing through the bit lines with a current flowing through the reference cell;

an erase circuit for erasing data of the memory cells by applying a voltage to at least one selected from the word lines, bit lines, source lines, and a semiconductor region including the memory cells; and an erase verify circuit for comparing a cell current of selected memory cells with a cell current of the reference cell by applying the first voltage to the memory cells to be erased while applying a second voltage different from the first voltage to a word line of the reference cell.

According to a thirteenth aspect of the present invention, there is provided a non-volatile semiconductor memory which comprises a memory cell array having a plurality of non-volatile memory cells each having three or more threshold voltage levels;

word lines, bit lines and source lines connected to the memory cells;

a row decoder for selecting one of the word lines;

a column decoder for selecting one of the bit lines;

at least one reference cell;

a read circuit for reading data of the memory cells by applying a first voltage to the word lines to compare a current flowing through the bit lines with a current flowing through the reference cell;

a program circuit for programming data to the memory cells by applying a voltage to at least one selected from the word lines, bit lines, source lines, and a semiconductor region including the memory cells; and a program verify circuit for comparing a cell current of selected memory cells with a cell current of the reference cell by applying the first voltage to the memory cells to be programmed while applying a second voltage different from the first voltage to a word line of the reference cell.

According to a fourteenth aspect of the present invention, there is provided a non-volatile semiconductor memory which comprises a memory cell array having a plurality of non-volatile memory cells each having four or more threshold voltage levels;

word lines, bit lines and source lines connected to the memory cells;

a row decoder for selecting one of the word lines; and a column decoder for selecting one of the bit lines;

wherein when the four threshold voltage levels are given by Vt1, Vt2, Vt3 and Vt4 (Vt1<Vt2<Vt3<Vt4), respectively, the following steps (1) to (5) are executed to carry out a program operation, (1) loading program data, (2) programs for the memory cells to be given by Vt2 and for those to be given by Vt3 being accomplished by a first gate voltage, (3) detecting whether the threshold voltages of the memory cells have Vt2 and Vt3, respectively, and re-executing the step (2) when they do not have Vt2 and Vt3, followed by a next step (4) when they have Vt2 and Vt3, (4) the program for the memory cells to be given by Vt4 being carried out by a voltage value (a third gate voltage) equal to or higher than a maximum value of a program gate voltage of the memory cells to be given by one of Vt2 and Vt3, and (5) detecting whether the memory cells given by Vt4 have the threshold voltage of Vt4, and re-executing the step (4) when they do not have Vt4, while finishing the program operation when they have Vt4.

According to a fifteenth aspect of the present invention, there is provided a non-volatile semiconductor memory which comprises a memory cell array having a plurality of non-volatile memory cells each having four or more threshold voltage levels;

word lines, bit lines and source lines connected to the memory cells;

a row decoder for selecting one of the word lines; and a column decoder for selecting one of the bit lines;

wherein when the four threshold voltage levels are given by Vt1, Vt2, Vt3 and Vt4 (Vt1<Vt2<Vt3<Vt4), respectively, the following steps (1) to (5) are executed to carry out a program operation, (1) loading program data, (2) the program for the memory cells to be given by Vt4 being accomplished by a value (a third gate voltage) which is equal to or higher than a maximum value of a program gate voltage of the memory cells to be given by one of Vt2 and Vt3, (3) detecting whether the threshold voltage of the memory cells to be given by Vt4 have Vt4, and re-executing the step (2) when they do not have Vt4, followed by a next step (4) when they have Vt4, (4) the program for the memory cells to be given by Vt2 and Vt3 being carried out by the first gate voltage, and (5) detecting whether the memory cells given by Vt2 and Vt3 have the threshold voltage of Vt2 and Vt3, respectively, and re-executing the step (2) when they do not have Vt2 and Vt3, respectively, while finishing the program operations when they have Vt2 and Vt3.

BRIEF DESCRIPTION OF THE DRAWINGS

FIG. 14 is a table for explaining voltage setting of each signal in each adjusting step using the Vt adjusting circuit of FIG. 13;

FIG. 15 is a diagram showing another example of Vg-Icell characteristics during a program verify in the memory cells of FIG. 1;

DETAILED DESCRIPTION OF THE INVENTION

Embodiments of the present invention will now be described with reference to the accompanying drawings.

Figure 1:
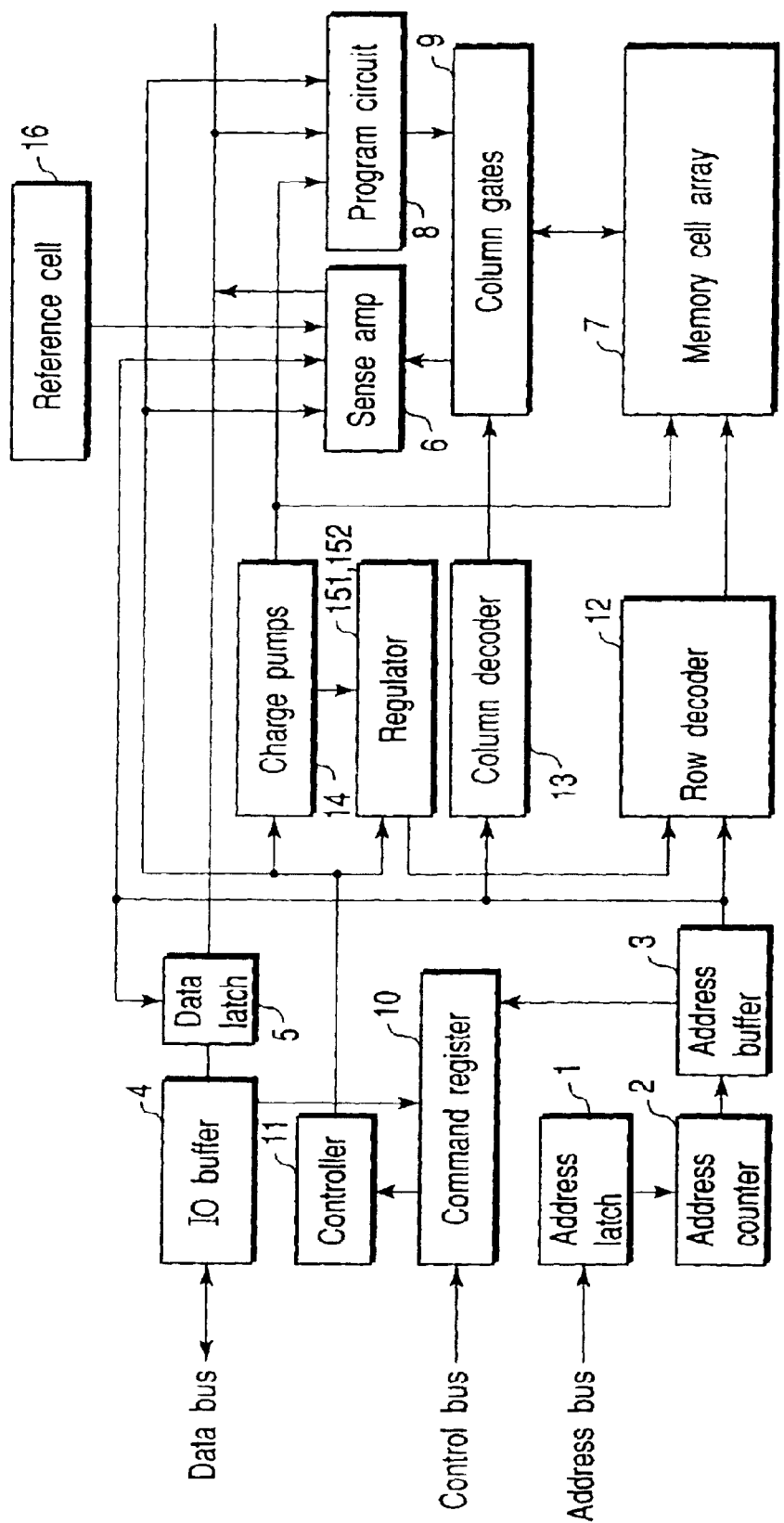
FIG. 1 is a block diagram schematically showing one example of a structure of 4-level Flash memory in a non-volatile memory according to one embodiment of the present invention.

FIG. 1 is a block diagram schematically showing one example of 4-level Flash memory in a non-volatile memory according to one embodiment of the present invention.

In FIG. 1 an address latch 1 receives addresses from an external address bus and latches them. An address counter 2 receives the latched addresses of the address latch 1 and counts them. An address buffer 3 receives the counted output of the counter 2 to provide internal addresses corresponding to memory cells to be read, programmed or erased.

An I/O buffer 4 carries out transfer of read data/program data between an external data bus and an internal data latch 5.

A memory cell array 7 includes a plurality of non-volatile memory cells together with at least one reference cell, and further includes word lines, bit lines and source lines connected to the memory cells.

A sense amplifier 6 senses data of memory cells within the memory cell array through a column gate 9 during reading, whereby the data is output to a data latch 5. In this case, the data of the memory cells can be read by comparing a current of the memory cells, which flows through a bit line by applying a first voltage to a word line, with a current, which flows through a reference cell 16 by applying the first voltage to a reference word line.

Program data is input to a program circuit 8 from the data latch 5 during the program, so that a program voltage is applied through a column gate 9 to a corresponding bit line of a memory cell array 7. In this case, it can be possible to program the data of memory cells by applying a voltage to at least two selected from the word line, the bit line, a source line, and a semiconductor region having memory cells.

A command register 10 keeps commands such as program commands, erase commands and the like input from an external control bus.

A controller 11 receives the commands kept at the command register 10 to generate a control signal for controlling respective circuits of the memory.

A row decoder 12 receives an internal address output from the address buffer 3 to select a corresponding word line within the memory cell array 7. A column decoder 13 receives the internal address output from the address buffer 3 to select and drive a column gate within the column gate circuit 9 according to the internal address. A selected bit line within the memory cell array 7 is then connected to a sense amplifier 6 through the column gate circuit 9.

A charge pump circuit 14 acting as a booster circuit increases an external power supply voltage to generate a voltage of 5 V for programming, a voltage of 10 V (Vpp) for erase and a voltage of −7 V, respectively.

The voltages of 5 V, −7 V and 10 V generated at the charge pump circuit 14 are supplied to the program circuit 8, the memory cell array 7 and a regulator circuit, respectively. The regulator circuit is constituted by, for example, D/A converter circuit, and includes first and second regulators 151 and 152.

These regulators 151 and 152 are intended to provide a various voltages Vreg, which are applied to word lines, that is, control gates of the memory cells, during programming and reading of the memory cells, from the voltages obtained from the charge pump circuit 14.

Therefore, it is not necessary that the Flash memory does not includes a plurality of the charge pump circuits, thereby to prevent increase in the chip size. In addition, since comparatively large current flows through the charge pump circuit 14 to increase the consumption current, it can be reduced by decreasing the number of the charge pump circuit 14.

Further, the voltage Vreg generated at the regulators 151 and 152 is applied via the row decoder 12 to word lines within the memory cell array, that is, the control gates of memory cells.

Further, an erase circuit (not shown) is provided, which erases data of the memory cells by applying a voltage to word lines, bit lines, source lines and/or the semiconductor region including the memory cells.

Still further, an erase verify circuit (not shown) is provided, which is constituted so that the output voltage of the first regulator 151 is applied to a word line of memory cells to be erased, and the output voltage of the second regulator 152 is applied to a word line of the reference cell to compare a cell current of the selected memory cell with a cell current of the reference cell, thereby detecting whether the erase is finished.

Further, a program verify circuit (not shown) is provided, which is constituted in such a manner that the output of the first regulator 151 is applied to a word line of the memory cells to be programmed, and the output of the second regulator 152 is applied to a word line of the reference cell, to compare a cell current of the selected memory cell with a cell current of the reference cell, thereby detecting whether the program is finished.

Figure 2A:
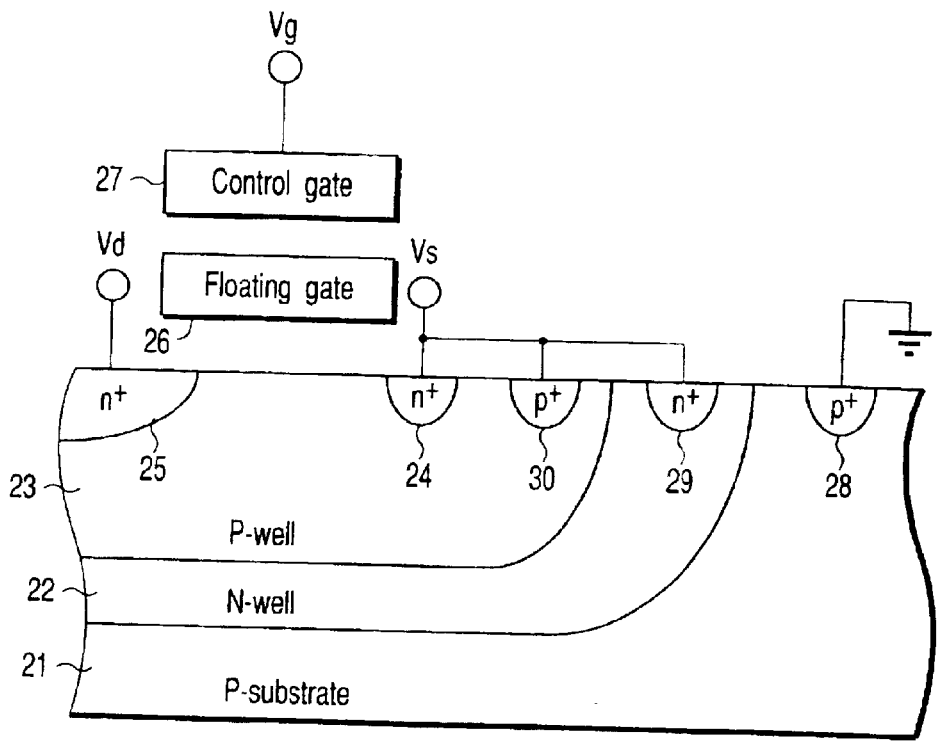
FIG. 2A is a cross-sectional view showing one non-volatile memory cell in a memory cell array of FIG. 1.

FIG. 2A shows a cross-sectional view of one non-volatile memory cell in the memory cell array shown in FIG. 1.

In FIG. 2A a P-type semiconductor substrate 21 includes an N-type well 22 in which an P-type well 23 is provided. $N^+$-type source and drain regions 24, 25 of the memory cells, spaced apart from each other, are formed in the P-type well 23. A floating gate 26 is provided through an insulating film (not shown) over a channel region between the source region 24 and the drain region 25, above which a control gate 27 is disposed through an insulating film (not shown).

Further, $p^+$-type contact region 28, $n^+$-type contact region 29 and $p^+$-type contact region 30 are provided on the P-type semiconductor substrate 21, the N-type well 22 and P-type well 23, respectively.

In the operation a gate voltage Vg, a drain voltage Vd and a source voltage Vs are applied to the control gate 27, the drain region 25 and the source region 24, respectively. In addition, the same voltage as the source voltage Vs is applied to both the contact regions 29 and 30, while ground potential of 0 V is applied to the contact region 28.

Each of the memory cells stores a level "1" and a level "0" according to the amount of electrons accumulated in the floating gate 26. Then, according to the levels of the stored data, the threshold voltage is varied. The memory cell array is provided by a large number of the memory cells.

Figure 2B:
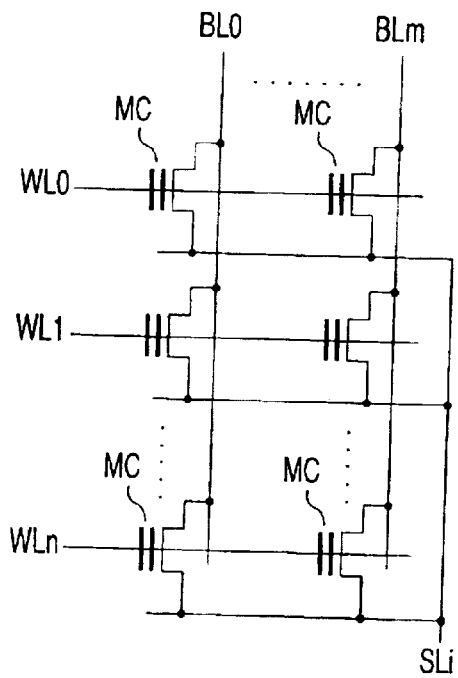
FIG. 2B is an example of a part of a circuit in the memory cell array.

FIG. 2B shows a part of a circuit in the memory cell array in the case where the Flash memory of FIG. 1 is, for example, NOR type.

A plurality of memory cells MC are arranged in a matrix of rows and columns. The control gates of the memory cells MC arranged in the same row are connected in common to one of word lines ML0 to WLn. The drain regions of the memory cells MC arranged in the same column are connected in common to one of bit lines BL0 to BLm. In general the memory cells are divided into a plurality of blocks, and the source regions of the memory cells MC in the same block are connected in common to one of source lines SLi.

One example of values (bias conditions) will be explained on the gate voltage Vg, the drain voltage Vd and the source voltage Vs applied to the memory cells during read, program and erase, respectively.

During the read operation, Vg, Vd and Vs are set to 5 V, 1 V and 0 V, respectively. During the program operation, Vg and Vs are given by 9 V and 0 V, respectively, and Vd is given by 5 V for the programming memory cells for programming data "0", while Vd is given by 0 V for another memory cells which is keeping a first data of "1". Further, during the erase operation Vg and Vs are set to −7 V and 10 V, respectively, and Vd is kept at a floating condition.

The read of data is judged whether a cell current flows or not when a gate voltage Vread (5 V in this case) is applied to the control gate while applying a desired voltage (1 V in this case) to the drain region. This judgment is accomplished by a sense amplifier (not shown) by comparing the cell current with a reference current Icell flowing through a reference cell.

The erase operation is carried out in the lump in a plurality of memory cells having the P-type well 23. In this case, electrons are supplied from the floating gate 26 to the P-type well 23 according to Fowler Nordhein (F•N) tunneling phenomenon, thereby transferring the memory cells to be erased to cells "1".

The program is accomplished for every one memory cell. A bit line of a memory cell to be programmed is biased to 5 V, and high energy electrons generated by a channel hot electron phenomenon are then injected into the floating gate 26. A bit line of cell "1" for keeping the first data "1" is 0 V. Accordingly, the injection of electrons for the floating gate does not occur in the non-program memory cell, whereby change in the threshold voltage Vth is not provided.

During program and erase operations, program verify and erase verify operations are carried out in the Flash memory in order to confirm their degrees. In the program verify operation, a voltage of the control gate 27 is set to a voltage Vpv (for example, 7 V) higher than a read voltage Vread (5 V in this case) to accomplish "0" read operation. The program operation and the program verify operation are repeatedly executed to each other, and the program operation is finished after all of data of memory cells to be programmed becomes "0".

In the case of the erase operation, the voltage of the control gate 27 is set to a voltage Vev (for example, 3.5V) lower than the read voltage V read to carry out "1" read operation. The erase operation and the erase verify operation are repeatedly executed to each other, and the erase operation is finished after all of data of memory cells to be erased becomes "0". The cell current Icell can be sufficiently obtained.

As described above, the voltage applied to the control gate of the memory cell will be variously changed such as 9 V, 7 V, 5 V and 3.5 V according to the operation modes. The voltages of 9 V, 7 V and 5 V are higher than a power supply voltage supplied from the outside.

In order to produce various voltages such as 9 V, 7 V, 5 V etc. higher than the power supply voltages supplied from the outside, a plurality of booster circuits for boosting the power supply voltage are provided, and outputs of the booster circuits are suitably selected by switches and are applied to the control gates of the memory cells.

The booster circuits for boosting the power supply voltage have been employed in memories, such as Flash memories described above, for producing in the chip various higher voltages than the power supply voltages supplied from the outside to carry out data read and data reprogram.

Figure 3:
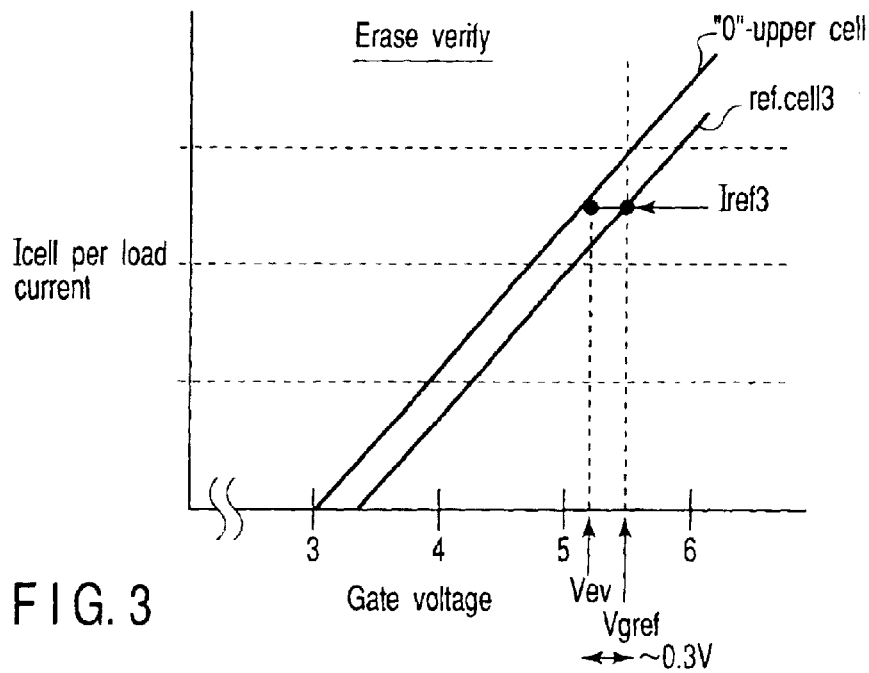
FIG. 3 is a diagram showing Vg-Icell characteristics of a cell current Icell of the memory cell and a cell current Iref of a reference cell during an erase verify in the memory cells of FIG. 1.

FIG. 3 shows Vg-Icell characteristics of the cell current Icell of the memory cell and the cell current Iref of the reference cell during an erase verify in the memory of FIG. 1.

Vt (a voltage that the cell current becomes zero.) is previously adjusted in the reference cell for providing the reference current Iref 3 when the reference cell is tested in the form of a wafer. In this case, the reference current Iref3 becomes the judgment standard of the data "3".

Figure 4:
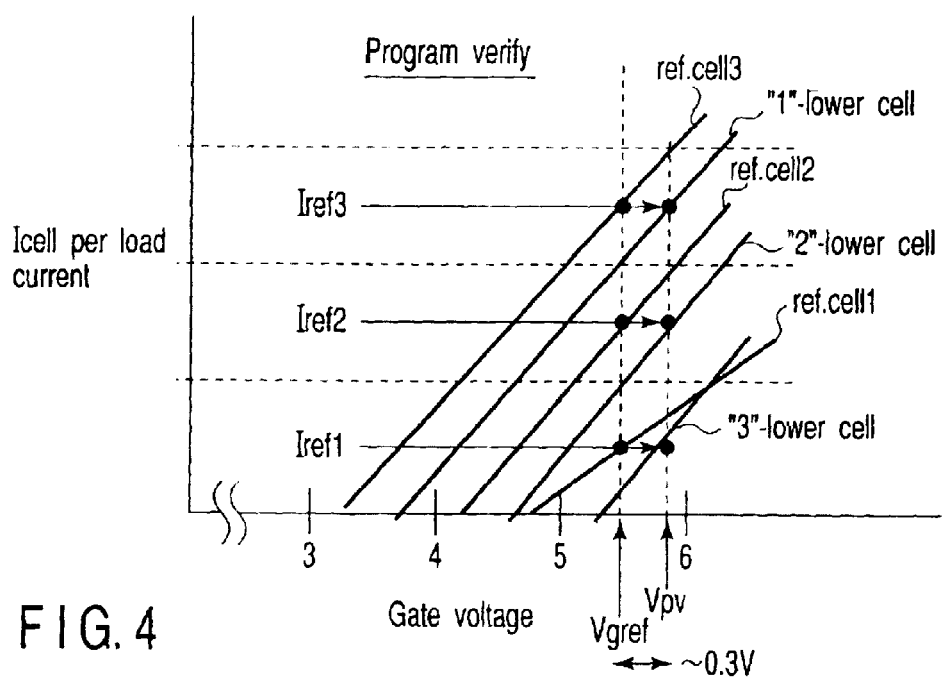
FIG. 4 is a diagram showing one example of Vg-Icell characteristics of the cell current Icell of the memory cell and the cell current Iref of the reference cell during a program verify in the memory cells of FIG. 1.

FIG. 4 shows one example of Vg-Icell characteristics of the cell current Icell of the memory cell and the cell current Iref of the reference cell during the program verify in the memory of FIG. 1.

Vt is also adjusted during the test in the reference cells for providing both the reference current Iref1 that becomes the judgment standard of the data "1" and the reference current Iref2 that becomes the judgment standard of the data "2", respectively.

In this case, a verify voltage Vpv, which is common for data "1", "2", and "3", is applied to the word line of the memory cells.

Figure 5:
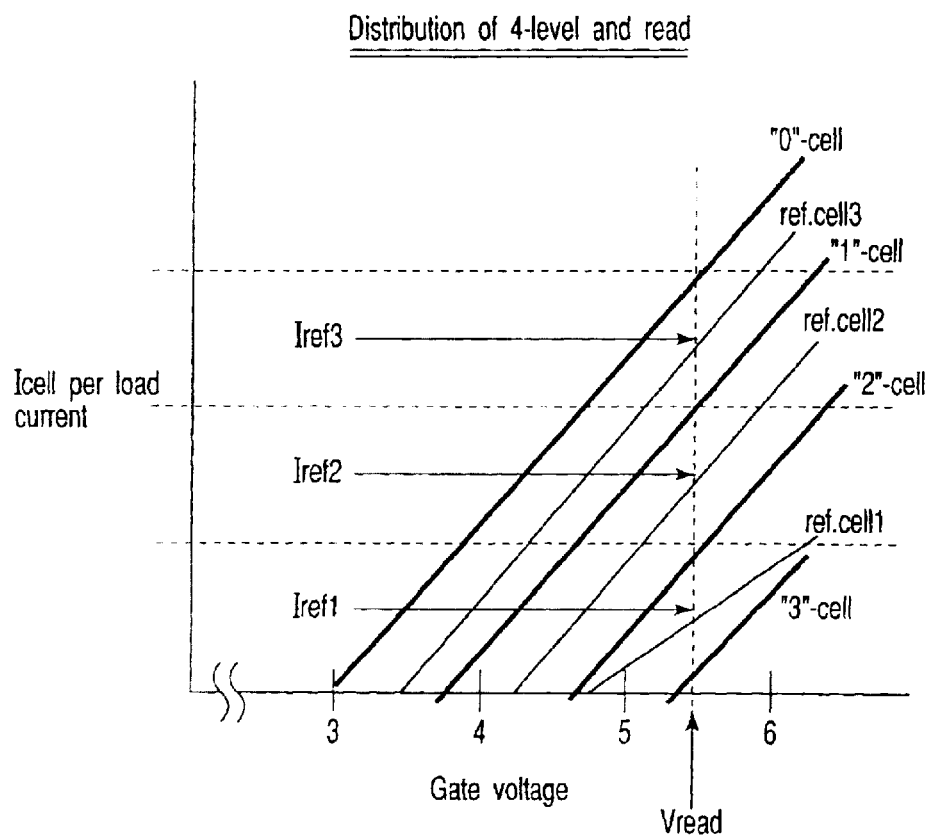
FIG. 5 is a diagram showing Vg-Id characteristics of the memory cell and the reference cell during read in the memory cells of FIG. 1.

FIG. 5 shows Vg-Id characteristics of the memory cells and the reference cells during the read in the memory of FIG. 1.

In this case, Vg of the memory cells and the reference cells is Vddr during the read, but Vg of the memory cells is Vsw and Vg of the reference cells is Vswref during the verify as described below.

The feature of the characteristics shown in FIG. 3 to FIG. 5 is that two kinds are given as the cell current characteristics per the load current of the reference cells.

Figure 26:
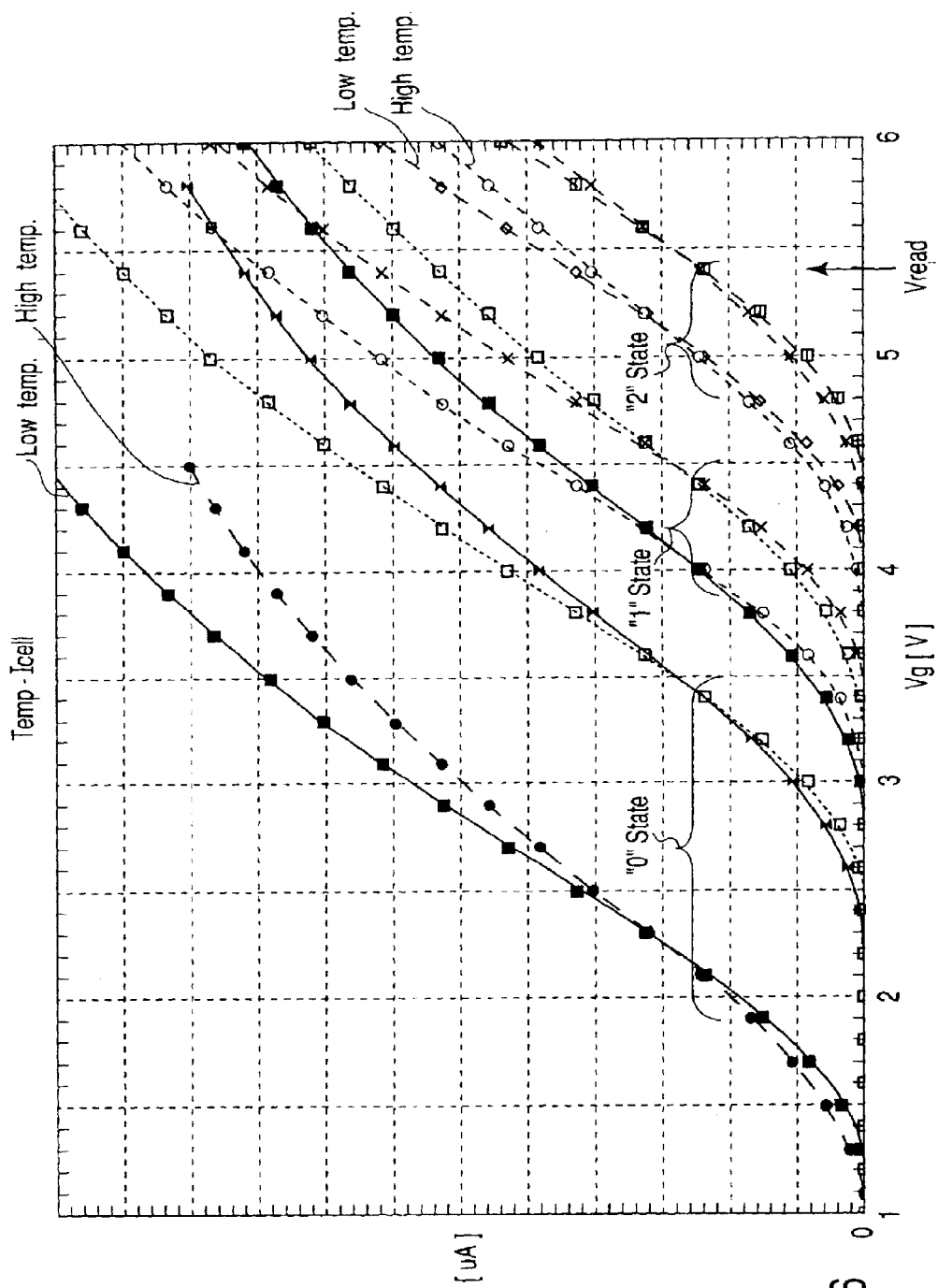
FIG. 26 is characteristics showing a portion corresponding to a part of "0", "1", "2", "3", of 4-level data in the Vg-Id characteristics in the memory cells of a 4-level Flash memory.

That is, since the temperature gradient of the cell current Icell of the memory cells having the data "0", "1" and "2", is high, the cell current characteristics of the reference cells becoming the judgment standard of the data "0", "1" and "2", are approximately parallel to those per the load current of the memory cells as previously described with reference to FIG. 26.

On the contrary, since the temperature gradient of the cell current of the memory cells having the data "3" is low, the reference cells becoming the judgment standard of the data "2", and "3" have the similar cell current characteristics to those employed in the conventional 2-level memories, as previously described with reference to FIG. 26. That is, the gradient of the cell current Iref1 of the reference cell becoming the judgment standard of the data "3" is set to about ½ of the gradient of the cell current Icell of the memory cells. Still more, the gradient of Iref1 may be set to that of Icell for the purpose of simplifying the structure.

Figure 6:
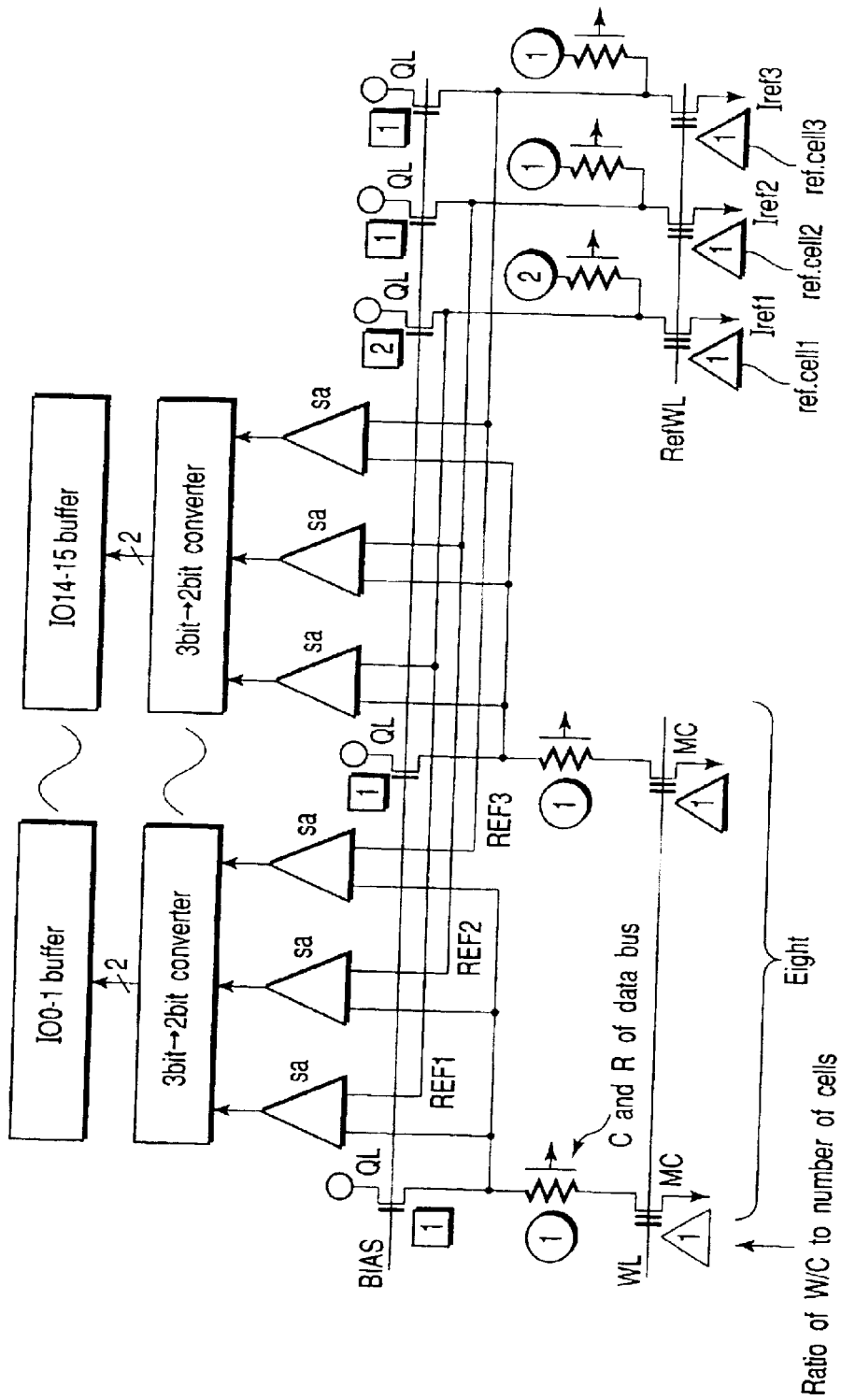
FIG. 6 is a circuit diagram showing a connection among sense amplifiers, reference cells and data lines in the memory cells of FIG. 1.

FIG. 6 shows a connection among sense amplifiers, reference cells and data lines in the memory of FIG. 1.

In FIG. 6, a numeral surrounded by □, ○ and Δ represents each ratio of a channel width W, the number N of data lines and the number M of cells, respectively. W is in proportion to N. Reference voltages REF1, REF2 and REF3 are input in common to sense amplifiers as a group of which is provided by three.

Figure 7A:
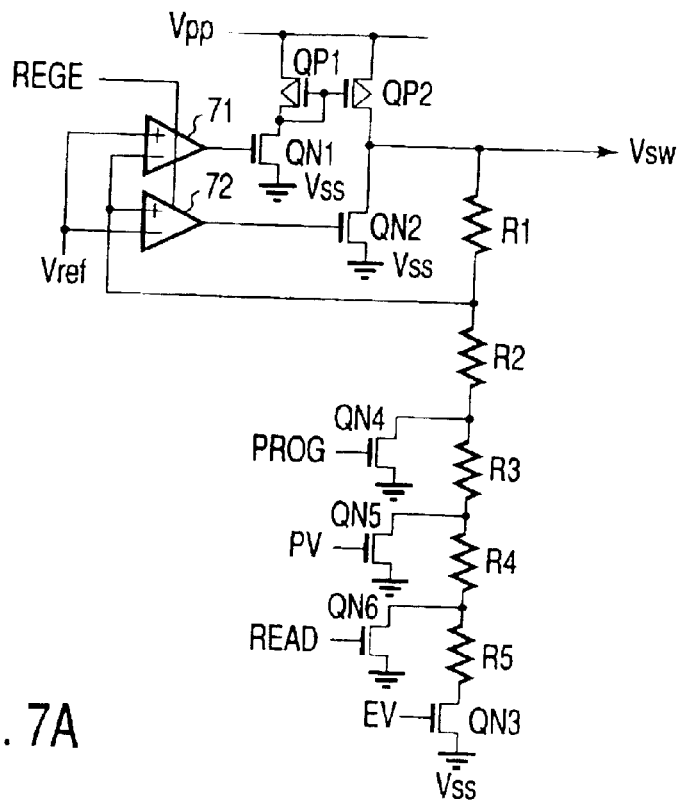
FIGS. 7A and 7B are circuits showing examples of two regulators in FIG. 6.
Figure 7B:
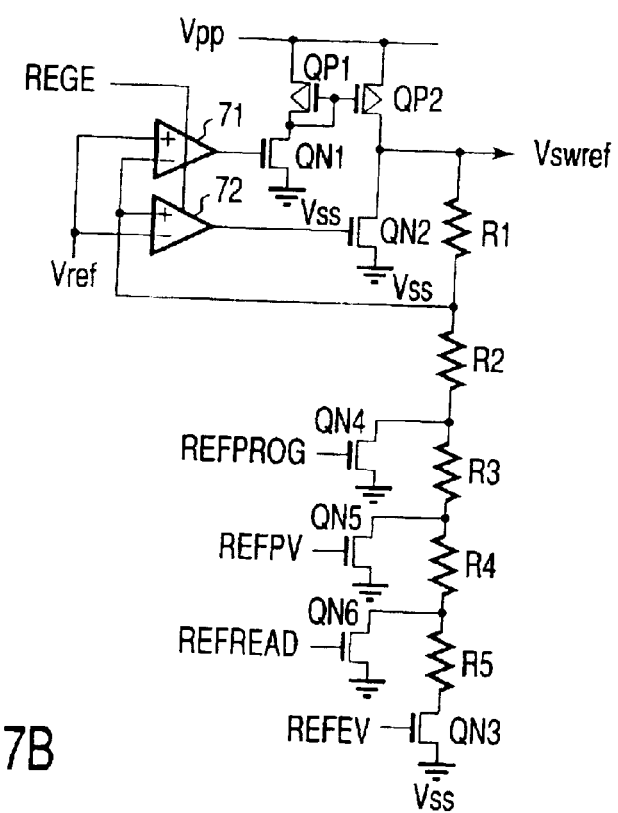

FIGS. 7A and 7B show one example of two regulators in FIG. 1, respectively.

A first regulator circuit shown in FIG. 7A has a role of a word line voltage control circuit for controlling a word line voltage Vwl which is applied to word lines of the memory cells, and receives a reference voltage Vref to provide a voltage Vsw controlled according to a program signal PROG, a program verify signal PV, a read signal READ and an erase signal EV, respectively.

A second regulator circuit shown in FIG. 7B has a role of a reference word line voltage control circuit for controlling a reference word line voltage Vwlref which is applied to word lines Refwl of reference cells, and receives the reference voltage Vref to provide a voltage Vswref according to a program signal REFPROG for reference, a program verify signal REFPV, a read signal REFREAD, and an erase signal REFEV, respectively.

In this example, the word line voltage control circuit has basically the same structure as the reference word line voltage control circuit.

A concrete circuit configuration of each regulator circuit will be described.

In the regulator circuits, two comparators 71 and 72 are activated and controlled by a regulator activation signal REGE. A source of PMOS transistor QP1 is connected to a supply node of a voltage Vpp, and agate thereof is connected to a drain. A source of PMOS transistor QP2 is connected to a supply node of the booster voltage Vpp, and a gate thereof is connected the gate of the transistor QP1 in common. A drain of the transistor QP2 is connected to an output node (Vsw or Vswref is output) of the regulator, thereby providing a current mirror circuit together with the transistor QP1.

A drain of NMOS transistor QN1 is connected to the drain of the transistor QP1, and a source thereof is connected to a node (Vss node) of ground potential Vss. The output of the comparator 71 is supplied to its gate. A drain of NMOS transistor QN2 is connected to the drain of the transistor QP2, while a source thereof is connected to the Vss node, and the output of the comparator is supplied to its gate.

Five resistors R1, R2, R3, R4 and R5 acting as a voltage divider and one NMOS transistor QN3, to which gate the signal EV or REFEV is applied during the erase verify, are connected in series between the output node and the Vss node. An NMOS transistor QN4 with drain and source is connected between the connection node of resistors R2 and R3 and the Vss node, and the program signal PROG (or REFPROG) is applied to its gate. An NMOS transistor QN5 with drain and source is connected between the connection node of resistors R3 and R4 and the Vss node, and the program verify signal PV (or REFPV) is applied to its gate. An NMOS transistor QN6 with drain and source is connected between the connection node of resistors R4 and R5 and the Vss node, and the read signal READ (or REFREAD) is applied to its gate.

The reference voltage Vref is applied to both a noninverting input terminal (+) of the comparator 71 and an inverting input terminal (−) of the comparator 72, and a divided voltage of the connection node between R1 and R2 is applied to both an inverting input terminal (−) of the comparator 71 and a noninverting input terminal (+) of the comparator 72. The comparators 71 and 72 are operated when the regulator activation signal REGE is level "H", thereby to compare the input voltages.

In such a structure, during level "H" of both the activation signal REGE and the program signal PROG (or REFPROG) the transistor QN4 is on, so that the voltage (Vsw or Vswref) of the output node is divided by the five resistors R1 to R5. The divided voltage is then input to the comparators 71 and 72.

In this case, the voltage (Vsw or Vswref) of the output node is approximately 0 volt just after the regulator activation signal REGE is level "H", and the divided voltage divided by the five resistors R1 to R5 is lower than Vref. Therefore, the output of the comparator 71 becomes level "H", while the output of the comparator 72 becomes "L". The transistor QN1 is then on, and the transistor QN2 is off, whereby a current I1 will flow through transistors QP1 and QN1 toward Vss node from the node of the voltage Vpp. According to the current I1, a current I2 then flows through the transistor QP2 toward the output node of the regulator from the node of the voltage Vpp (prescribed value is 10 V), thereby charging the output node. At the result, the output voltage (Vsw or Vswref) starts to rise. When the output voltage exceeds 9 V of the prescribed value, the divided voltage at the connection node between R1 and R2 becomes higher than the reference voltage Vref. The output of the comparator 71 is then inverted from level "H" to level "L", while the output of the comparator 72 is inverted from level "L" to level "H". Hereafter, the transistor QN1 is off and the transistor QN2 is on, so that the current I1 does not flow therethrough. The output node is then discharged through the transistor QN2 toward Vss node, whereby the output voltage begins to reduce.

As described above, the divided voltage at the connection node between R1 and R2 is compared with the reference voltage Vref by the comparators 71 and 72. Depending upon the comparison, the transistors QN1 and QN2 are on/off controlled. The output voltage (Vsw or Vswref) is controlled by the charge and discharge of the output node so that it is usually coincident with the prescribed value (9 V) during programming.

Next, a typical program operation will be explained on the operation of the regulator circuit.

When the program signal PROG (or REFPROG) is level "L" and the program verify signal PV (or REFPV) is level "H", the transistor QN4 is off, and the transistor QN3 is on. Therefore, the output voltage (Vsw or Vswref) is divided by the five resistors R1 to R5, so that the divided voltage having a lower resistance division ratio than that during programming is input to the comparators 71 and 72. In this case, respective resistors of R1 to R5 are set so that the divided voltage, which is obtained when the output voltage (Vsw or Vswref) reached 7 V lower than the 9 V of the prescribed value, is equal to the value of the divided voltage which is obtained when the output voltage (Vsw or Vswref) is 9 V.

Accordingly, during the program verify the divided voltage at the connection node between R1 and R2 is compared with the reference voltage by the comparators 71 and 72. Depending upon the compared result, NMOS transistors QN1 and QN2 are on/off controlled, and the output voltage (Vsw or Vswref) is controlled so that it is usually coincident with the prescribed value (7 V) during the program verify.

Still more, it is possible to obtain margin between the cell current Icell of the memory cell and the cell current Iref3 of the reference cell by setting the difference between Vswref and Vsw to approximately 0.3 V since the signals EV and REFREAD become "H". In this case, because two control circuits have basically the same structure, variation in difference between Vswref and Vsw can be controlled even if the reference voltage is varied.

Figure 8A:
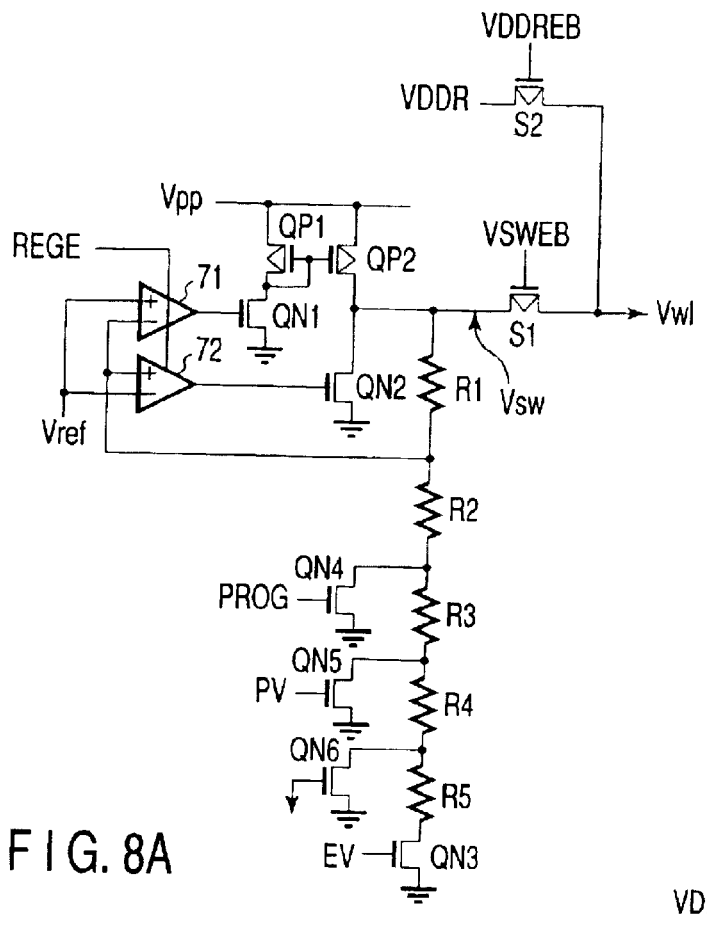
FIGS. 8A and 8B are circuits showing modified examples of the regulators in FIGS. 7A and 7B.
Figure 8B:
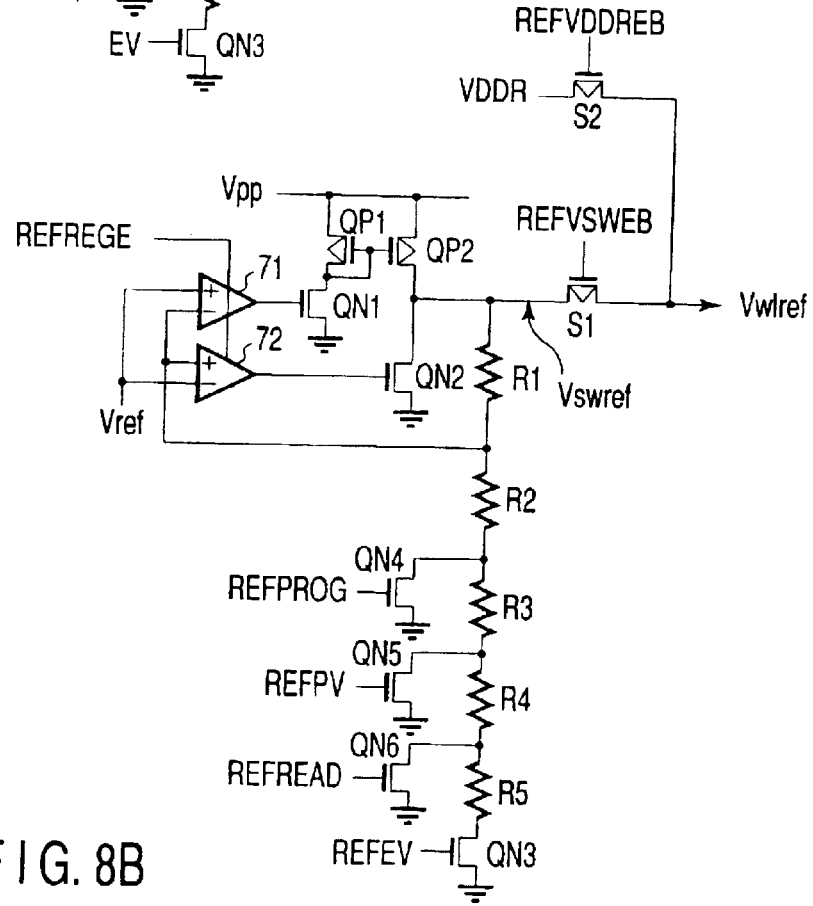

FIGS. 8A and 8B represent modified examples of the regulator circuits shown in FIGS. 7A and 7B.

A regulator circuit shown in FIG. 8A differs from that shown in FIG. 7A in that one end of a switch s1 is connected to the output node Vsw, that one end of a switch s2 is connected to a power supply VDDR, that another ends of both switches s1 and s2 are connected in common to provide an output node of a word line voltage Vwl, and that both switches are selectively controlled by control signals VSWEB and VDDREB. The other configuration is the same as the regulator circuit of FIG. 7A.

During the program, the erase, the program verify and the erase verify, VSWEB becomes "L" and VDDREB becomes "H" to select Vsw as the word line voltage Vwl. On the contrary, during the read, VSWEB becomes "H" and VDDREB becomes "L" to select VDDR as the word line voltage Vwl.

A regulator circuit shown in FIG. 8B differs from that shown in FIG. 7B in that one end of a switch s1 is connected to the output node Vswref, that one end of a switch s2 is connected to the power supply VDDR, that another ends of both switches s1 and s2 are connected in common to provide an output node of the word line voltage Vwlref, and that both switches are selectively controlled by control signals REFVSWEB and REFVDDREB. The other configuration is the same as the regulator circuit of FIG. 7B.

During the program, the erase, the program verify and the erase verify, REFVSWEB becomes "L" and REFVDDREB becomes "H" to select Vswref as the word line voltage Vwlref. On the contrary, during the read, REFVSWEB becomes "H" and REFVDDREB becomes "L" to select VDDR as the word line voltage Vwlref.

Figure 9:
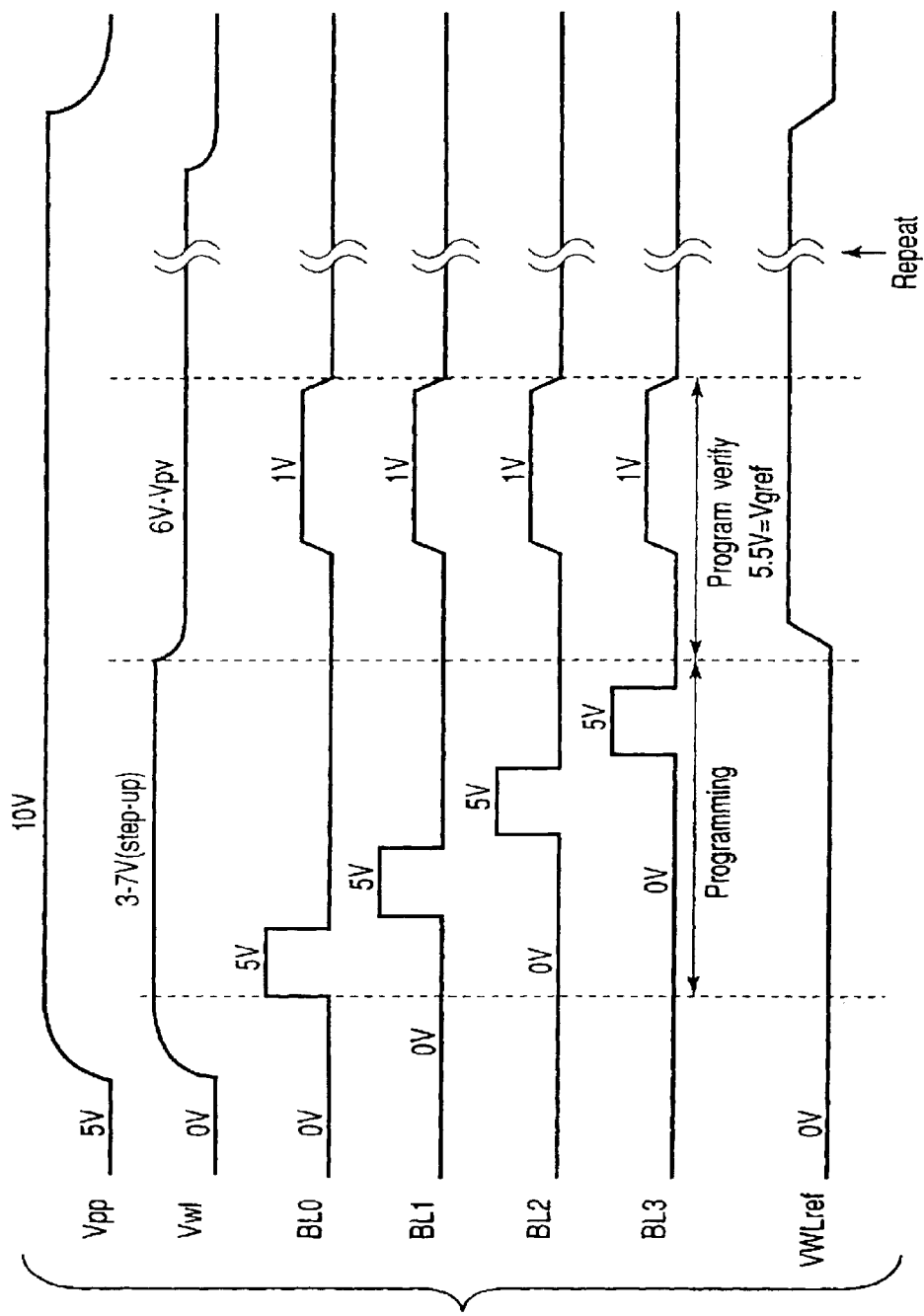
FIG. 9 is waveforms showing one example of a program operation for four cells in the memory cells of FIG. 1.

FIG. 9 shows one example of operation waveforms in the case where the program is carried out for four cells in the memory of FIG. 1.

One or more bit is programmed in order. After finishing the program, the program verify read is accomplished in the lump. If there is a cell with program lack, the program and the verify read are again carried out by increasing the word line voltage as compared with the previous program voltage. When cells of "1", "2" and "3" are programmed, their programmed data are renewed. After these operations are repeated so that all of next program data become all of "0", the program is finished.

Further, the bit lines for programming "0" are 0 V or a floating state, while another bit lines for programming other distributions are given by approximately 5 V at which programming due to hot electrons is possible. When the number of bit lines are increased, they are divided and programmed.

After applying a program pulse, a program verify is accomplished with a sense amplifier for the program verify. In this case, memory cells to be programmed may be verified at the same time, or the verify may be carried out by dividing memory cells. However, according to the former, though the verify time can be reduced, the circuit area and the consumption current may be increased as it is required that the number of the sense amplifiers is same as that of program bits. According to the latter, as the number of the sense amplifiers can be more reduced, the circuit area and the consumption current can be suppressed, but the verify time may be increased.

In the program verify, 16-bit data is verified at the same time, using a sense amplifier having the similar structure to that of the sense amplifier sa, for example, shown in FIG. 6. The level of the cell is read out by comparing Icell with Iref1, Iref2 and Iref3. At this time, the word line voltage of the cell and the word line voltage of the reference cell are given by Vpv and Vread, respectively, these two voltages are output from the similar circuit. As outputs of three sense amplifiers are converted to 2 bits of binary, 24 sense amplifiers sa provide 16 bits.

Figure 10:
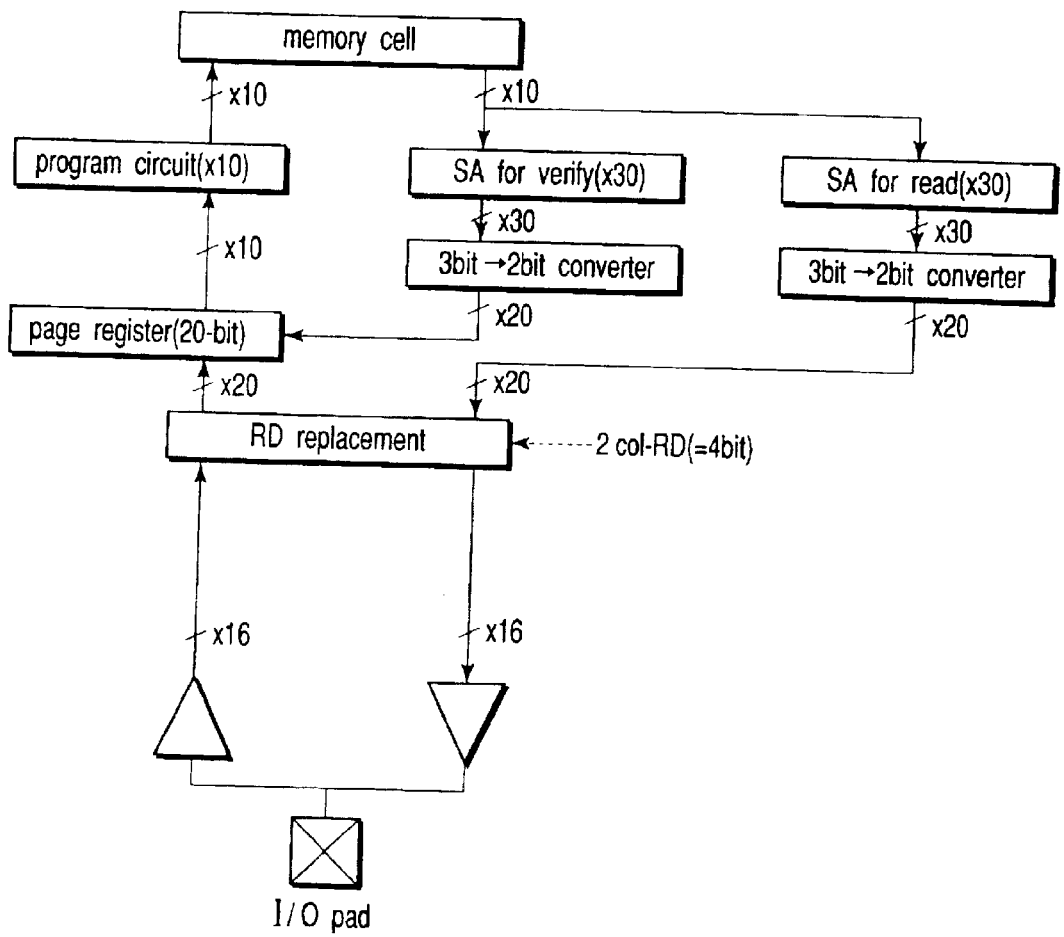
FIG. 10 is a diagram showing one example of a data pass in the case where the memory cells of FIG. 1 are not provided with an error correction circuit.

FIG. 10 shows one example of a data pass in the case where an error correction circuit (ECC) is not provided in the memory of FIG. 1.

Word programming is possible in the Flash memory, and the program input data of 1 word (16 bits) is kept at the input buffer. The program input data is latched to a program data register together with 4 bits of redundancy added by a redundancy replacement circuit (RD) for carrying out the replacement, depending upon column redundancy information. For example, there are provided 30 sense amplifiers (SA) for verify of the data pass and 30 sense amplifiers (SA) for read, respectively, and therefore the memory enables the verify and the read at the same time as the program.

Figure 11:
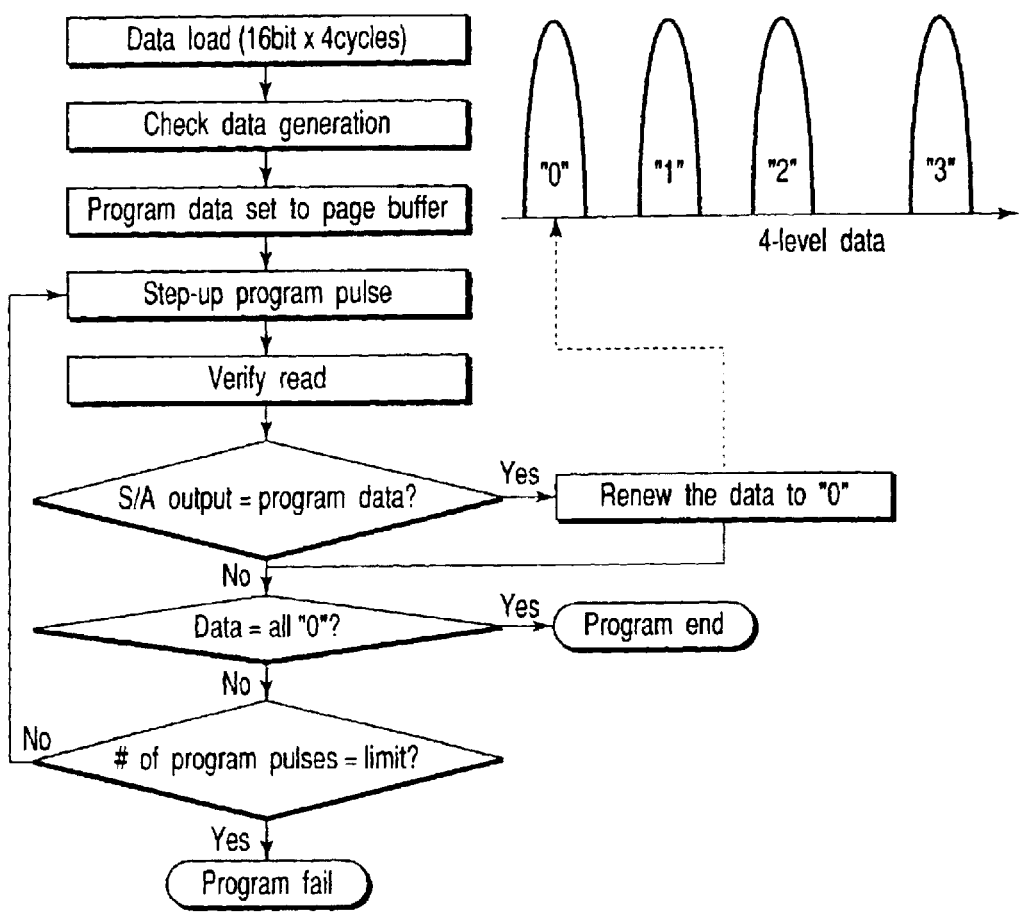
FIG. 11 is a flow chart showing one example of algorithm of the program operation in the memory cells of FIG. 1.

FIG. 11 shows one example of algorithm of the program operation in the memory of FIG. 1 where the error correction circuit (ECC) is provided therein.

At the first time, data is loaded by 16 bits×4 cycles to produce check data. Thereafter, the program operation is achieved according to a general sequence. It can be then possible to execute the redundancy and the error correction on the Flash memory at the same time.

Figure 12:
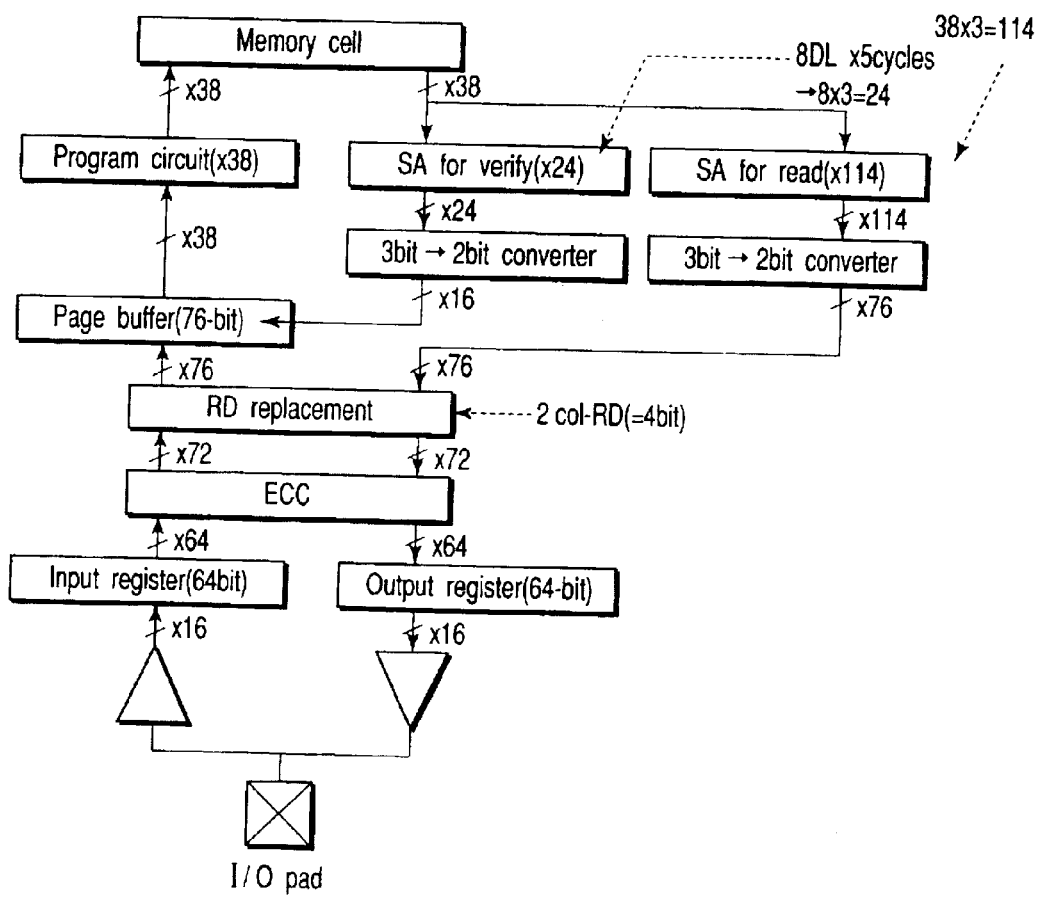
FIG. 12 is a diagram showing one example of the data pass in the case where the memory cells of FIG. 1 is provided with the error correction circuit.

FIG. 12 shows one example of a data pass in the case where the error correction circuit (ECC) is provided in the memory of FIG. 1. In the Flash memory, a page program is possible by the sequence, for example, shown in FIG. 11. During the programming, program data of N bits (64 bits in the example) is input to an input register via an input buffer with 16 bits×4 cycles. In this 64-bit data, the summed 72 bits of the check data of K bits (8 bits in the example) generated by ECC become the program bits. Further, depending upon redundancy replacement information (column redundancy data) produced by the redundancy replacement circuit, the replacement of L bits (since 2 column redundancies are employed, L is equal to 2 in the example), so that data of the summed 76 bits is latched to the page buffer. The program circuits are prepared by the same number as the memory cells to be programmed at the same time.

Figure 24:
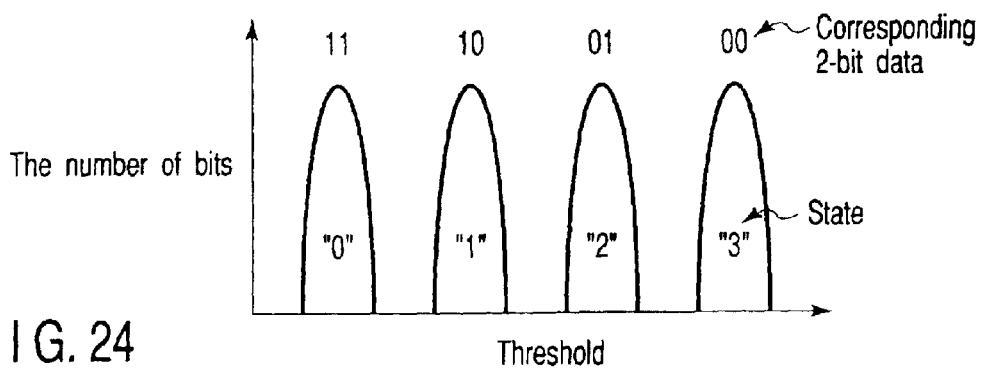
FIG. 24 is a diagram showing a distribution of threshold voltages of a Flash memory with 4-level cell array.
Figure 25:
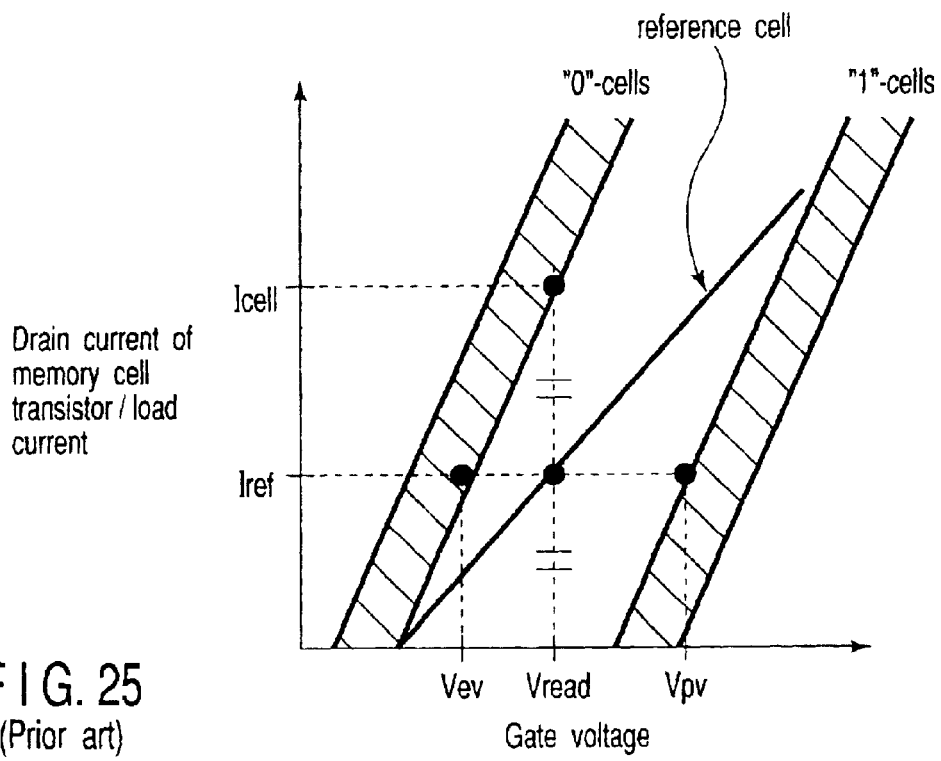
FIG. 25 is a diagram showing a relation between a gate voltage Vg, applied to control gates of a memory cell and a reference cell in a 2-level Flash memory, and a drain current Id (unit load current per a cell current)

The program is achieved as shown in, for example, FIG. 9, using a program pulse. If the program data and the output data of the verify sense amplifier are coincident, the program data latched to the page buffer is renewed to data "0", and if they are not coincident, the data latched to the page buffer is kept in that condition. By repeating it five times, renewal of the program data of 76 bits is accomplished. Checking whether all of 76 bits are "0" (referring to FIG. 24), the program operation is finished in that case. If it is not so, reprogram and program verify operations are achieved.

In the case where the read operation is carried out, different sense amplifiers for read (114 sense amplifiers) separate from sense amplifiers for verify (24 sense amplifiers). This is because it is necessary to read another bank during a program operation to a certain bank in a multilevel memory of a bank structure.

The sense amplifiers for read are prepared by pages (given by 38*3=114 amplifiers because 38 bit lines are read in this case.). 76 bits including 4 bits of the redundancy(RD)are input to the redundancy replacement circuit via 3 to 2 bit converter in the same manner as the verify, and the replacement is carried out depending upon the replacement information, thereby to provide 72 bits.

The error correction circuit (ECC) detects and corrects errors in 72 bits, and further transfers correct 64-bit data to an output register. If the memory has a page mode, a desired one word in latched four words can be provided by turning the lowest two addresses.

If the memory has a burst mode, the words can be output in turn in synchronization with clocks to be input according to a previously determined turning direction of the addresses. If the burst length is larger than the page size, next four words are sensed while the latched data is output to the output register.

After all of the latched data are output, it can be possible to provide continuously next data. How sets of the error correction circuits (ECC) are required depends upon the demand for the memory. When it is necessary to carry out the read during the load of the program data, two error correction circuits (ECC) for a test bit generation and for an error correction are required. If these are not necessary, it is possible to reduce the number of the error correction circuits (ECC) by combining two functions.

Figure 13:
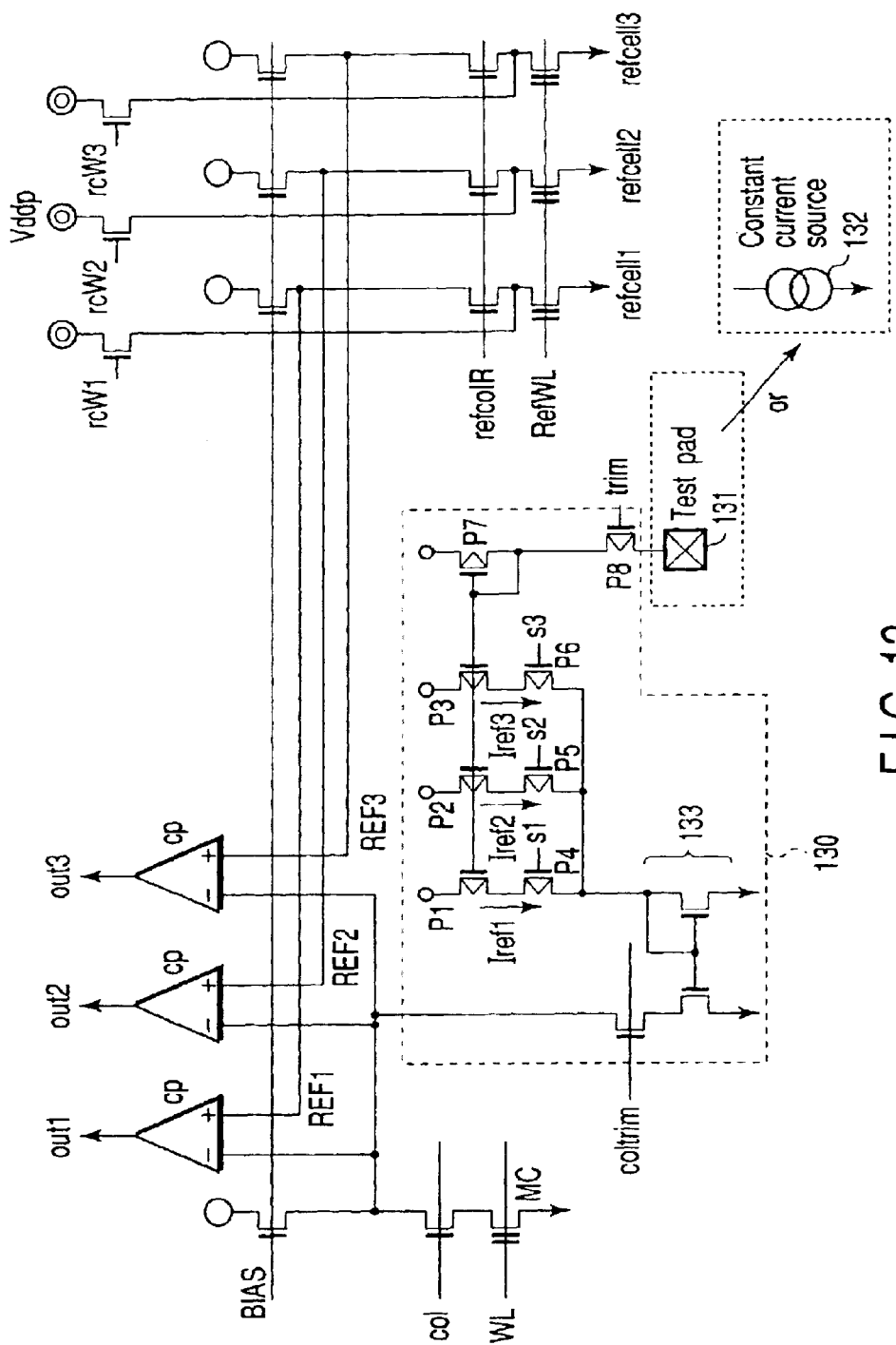
FIG. 13 is a circuit diagram showing one example of a Vt adjusting circuit of the reference cell in the memory cells of FIG. 1.

FIG. 13 shows one example of a Vt adjusting circuit of the reference cell shown in FIG. 1.

The circuit compares each cell current (each reference voltage REF1, REF2 and REF3 determined by each cell current) of three reference cells Refcell1, Refcell2 and Refcell3, respectively, with a cell current of selected one memory cell MC, and includes three comparator circuits cp (sense amplifiers sa) for reading data of the selected memory cell.

An input adjusting circuit 130 is connected to respective first input of three comparator circuits cp in common.

The input adjusting circuit 130 comprises a PMOS transistor P8, one end of which is connected to a test pad 131 or a constant current source 132 and to which gate a signal trimb is applied, a PMOS transistor P7, whose gate and drain are connected to each other, connected in series with the transistor P8, three PMOS transistors P1, P2 and P3 each of which is current mirror connected to the transistor P7, three PMOS transistors P4, P5 and P6, each of which is connected in series with the corresponding transistor P1, P2 and P3, respectively and to which gate a switch selection signal s1, s2 and s3 is applied, respectively, and a current mirror circuit 133 at which each one end of the transistors P4, P5 and P6 is connected in such a manner that a current flowing through a node connected in common is turned back to each of first inputs of the three comparator circuits, thereby controlling a first signal coltrim.

According the structure, when the first signal coltrim is a first logic (level "L" for example), the current mirror circuit 133 becomes off state, whereby each of the first inputs of the three comparator circuits cp is connected to the selected memory cell.

On the contrary, when the first signal coltrim is a second logic (level "H" for example), the current mirror circuit 133 becomes on state. Therefore, the current mirror circuit 133 is connected to the test pad 131 or the constant current source 132 through one of the transistors P4, P5 and P6, which is on state by one of the switch selection signals s1, s2 and s3, through one of the transistors P1, P2 and P3 corresponding to the transistors P1, P2 and P3, and through two PMOS transistors P7 and P8.

FIG. 14 shows voltage settings of each of signals in each of the adjusting steps using the Vt adjusting circuit of FIG. 13.

PMOS transistors P1, P2 and P3 in FIG. 13 have a varied current driving ability, which is set so that each of currents Iref1, Iref2 and Iref3 flows therethrough. After the program of one reference cell Refcell1, the verify is accomplished. These program and verify are repeated till an output out1 of a sense amplifier, to which the reference voltage REF1 is input, becomes "L". While fixing the constant current source, it can be possible to adjust residual reference cells Refcell2 and Refcell3 in the same manner as described above.

Therefore, according to the memory having Vt adjusting circuit of the reference cells as shown in FIG. 13, since one constant current source is used as the input of the memory side of the sense amplifier, and the first signal coltrim is set as the second logic, it can be possible to adjust the threshold voltages Vt of the three reference cells Refcell1, Refcell2 and Refcell3, respectively. Vt control can be then achieved accurately for a short time.

FIG. 15 shows another example of Vg-Icell characteristics during the program verify in the memory of FIG. 1.

Vg-Icell characteristics during the program verify represented in FIG. 4 show that the program verify is achieved for the cells "1", "2", and "3" with the voltage Vpv. As shown in FIG. 15, keeping the gate voltage Vgref of the reference cells at a constant voltage, the program verify of the cells "1" and "2", may be carried out by a gate voltage of Vpv1, 2, and the program verify of the cells "3", may be accomplished by a gate voltage of Vpv3.

Figure 16:
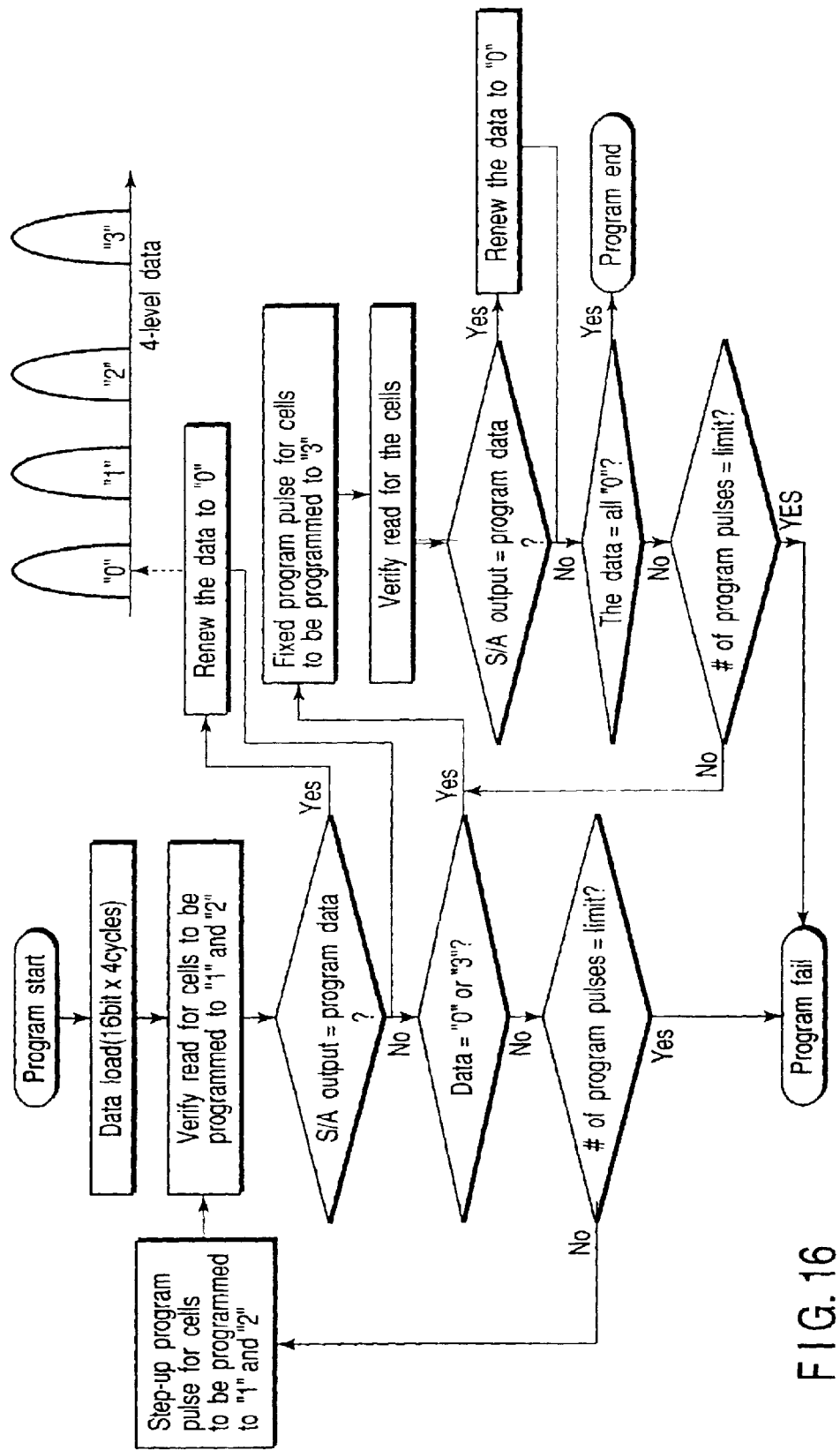
FIG. 16 is sequence in the case where program execution of cells "1" and "2" in the memory cells of FIG. 1 is separated from program execution of cells "3" thereof and the program of the cells "3" is executed after the program execution of the cells "1" and "2"

FIG. 16 shows sequence in the case where the program execution of the cells "1" and "2", in the memory of FIG. 1 is separated from that of the cells "3", and where the program execution of the cells "3" is carried out after the cells "1" and "2" are programmed.

That is, when the three threshold voltage levels of the cells are given by Vt1, Vt2 and Vt3 (Vt1<Vt2<Vt3), respectively, the following steps (1) to (5) are executed to carry out the program operation, (1) loading program data, (2) the program for the memory cells to be given by Vt2 being accomplished by a first gate voltage, (3) detecting whether the memory cells have Vt2, and carrying out the step (2) using a second gate voltage higher than the first gate voltage when they do not have Vt2, followed by a next step (4) when they have Vt2, (4) the program for the memory cells to be given by Vt3 being carried out by a value equal to or higher (a third gate voltage) than a maximum value of a program gate voltage of the memory cells to be given by Vt2, and (5) detecting whether the memory cells have Vt3, and re-executing the step (4) when they do not have Vt3, while finishing the program operation when they have Vt3.

Figure 17:
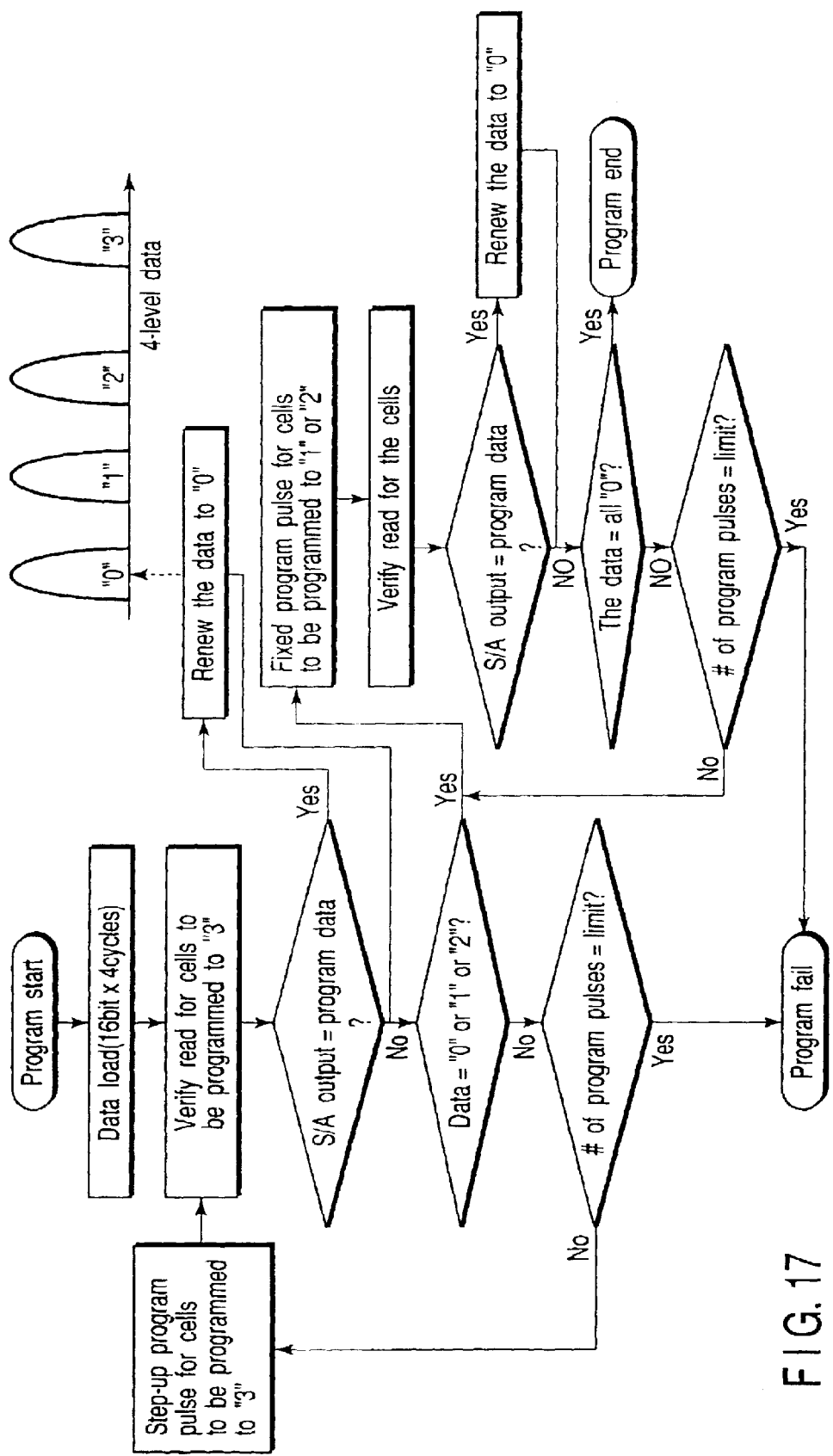
FIG. 17 is a sequence in the case where program execution of cells "1" and "2" in the memory cells of FIG. 1 is separated from program execution of cells "3" thereof and the program of the cells "1" and "2" is executed after the program execution of the cells

FIG. 17 shows sequence in the case where the program execution of the cells "1" and "2" in the memory of FIG. 1 is separated from that of the cells "3" and where the program execution of the cells "1" and "2" is carried out after the cells "3" are programmed.

Namely, when the three threshold voltage levels are given by Vt1, Vt2 and Vt3 (Vt1<Vt2<Vt3), respectively, the following steps (1) to (5) are executed to carry out a program operation, (1) loading program data, (2) the program for the memory cells to be given by Vt3 being accomplished by a voltage value (a third gate voltage) equal to or higher than a maximum value of a program gate voltage of the memory cells to be given by Vt2, (3) detecting whether the memory cells have Vt3, and re-executing the step (2) when they do not have Vt2, followed by a next step (4) when they have Vt2, (4) the program for the memory cells to be given by Vt2 being carried out by a first gate voltage, and (5) detecting whether the memory cells have Vt2, and executing the step (4) using a second gate voltage higher than the first gate voltage when they do not have Vt2, while finishing the program operation when they have Vt2.

As shown in FIGS. 16 and 17, the program time can be reduced by dividing the program sequences into a first sequence for the program to the highest level of the threshold voltage Vt of the cells and a second sequence except it.

Still more, during the first program verify for judging whether the cells have Vt2, the word line voltage of the selected memory cells is given by the first verify voltage, and the word line voltage of the reference cells is given by the second verify voltage lower than the first verify voltage. During the second program verify for judging whether the cells have Vt3, the word line voltage of the selected memory cells is given by the third verify voltage, and the word line voltage of the reference cells is given by the second verify voltage.

According to the Flash memory described with reference to FIGS. 1 to 17, two kinds of the cell current characteristics per the load current of the reference cell are combined, and the characteristics of the reference cells (current characteristics per unit load current) are set so as to be adapted to the temperature characteristics of the characteristic of each level state of 4-level cells (current characteristics per unit load current) as shown in FIGS. 3 to 5. Therefore, the stability of the operation and the reliability of the memory can be increased.

Further, as shown in FIGS. 7A and 7B, the first regulator 151 for controlling the voltage Vsw of the word lines of the memory cells and the second regulator 152 for controlling the voltage Vswref of the word line of the reference cell have basically the same structure. Therefore, even if the reference voltage Vref used in both regulators is varied, the variation in the difference between Vswref and Vsw can be suppressed because these voltages are linked to each other.

Still more, the similar advantages can be also obtained by producing the word line voltages for both the memory cells and the reference cells from two regulators during the program-erase-program verify-erase verify and by applying another power supply VDDR to both word lines during the read as shown in FIGS. 8A and 8B.

As shown in FIG. 6, the Flash memory includes first and second reference cells, first, second and third load current sources, a first load circuit for providing a first voltage output from both a first load current and a current flowing through one of bit lines by applying a first word line voltage to one of word lines, a second load circuit for providing a second voltage output from both a second load current and a current flowing through one of the bit lines by applying the first word line voltage to a word line of the first reference cells a first read circuit for deciding whether the memory cells are at one of first and second levels by comparing the first voltage output with the second voltage output, a third load circuit for providing a third voltage output from both a third load current and a current flowing through one of the bit lines by applying the first word line voltage to a word line of the second reference cells, and a second read circuit for deciding whether the memory cells are at one of second and third levels by comparing the second voltage output with the third voltage output, wherein N1/N2 is set so as to be larger than I1/I2 where N1 (N1≧1, positive integer) is the number of the first reference cells connected in parallel with one another, N2 (N2≧1, positive integer) is the number of the second reference cells connected in parallel with one another, I1 is the second load current and I2 is the third load current.

Therefore, since the cell current of the reference cells per the load current is given by the similar value to that of the memory cells, stable read and verify can be executed for both the temperature dependence of the cell current and variation in the cell current.

Further, since the load current of the reference cells having the highest threshold voltage is increased as compared with that of reference cells having the lowest threshold voltage, variation in the cell current for variation in the word line voltage can be suppressed.

Further, a read withstanding property for ground noises can be secured by proportioning the number of data lines connected to the load transistors at both the memory cell side and the reference cell side. In this case, the reference voltage is input to all of the sense amplifiers in common.

Still further, according to the Flash memory described above, the redundancy and the error correction can be executed at the same time on the Flash memory, because it includes the input buffer for keeping the programming input data, the error correction circuit (ECC) for producing test data for the error detection or correction from the input data, the redundancy replacement circuit for replacing programming data, comprised of the programming input data and the test data, depending of the column redundancy information, and the page buffer for latching the output of the redundancy replacement circuit.

In this case, since the Flash memory has the sense amplifiers for both verify and read, the read can be carried out from blocks which are not programming object even if the program time is increased due to the 4-level state.

Further, by executing the verify with a plurality of cycles, the number of the sense amplifiers for the verify can be reduced as compared with that of the sense amplifiers for the read, thereby to suppress the circuit area.

Still further, by accomplishing the error correction after the data read from the memory cells is replaced depending upon the redundancy information, the redundancy and the error correction can be executed on the Flash memory at the same time.

More further, according to the Flash memory, since Vt adjustment of the reference cells can be carried out using one constant current source as the input side of the sense amplifiers while monitoring the outputs of the sense amplifiers as shown in FIG. 13, Vt control with high accuracy can be accomplished for a short time.

Further, according to the Flash memory as described above, the program time can be reduced by separating the program sequence for the highest level of the threshold voltage Vt of cells from the another program sequence as shown in FIGS. 16 and 17.

The Flash memory may be constituted so that two regulators 151 and 152 are not employed in the case where another advantages may be obtained without necessity the advantages in the case of using two regulators 151 and 152.

A second embodiment of the present invention will be described on a 2-level mode/4-level mode switchable Flash memory.

Figure 18:
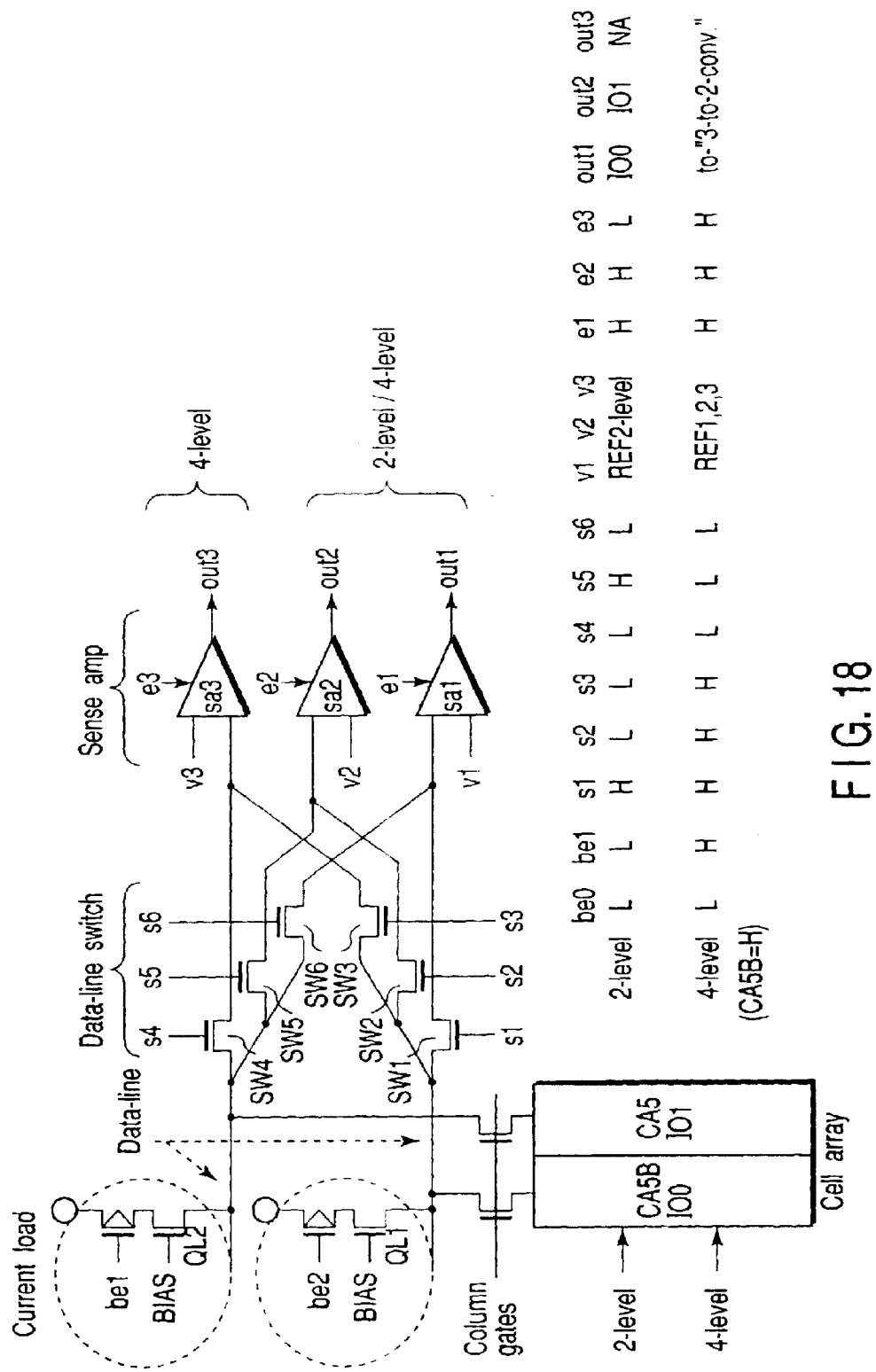
FIG. 18 is a connection between sense amplifiers and memory cells in a 2-level/4-level switchable Flash memory and control signals according to a second embodiment of the present invention.

FIG. 18 shows both a connection between sense amplifiers and memory cells in 2-level/4-level switchable Flash memory and control signals.

In FIG. 18, cells 0 belonging to IO0 in 2-level mode and cells 1 belonging to IO1 in the same mode are independent to each other. In 4-level mode, however, 2-bit data of cells 0 and 1 belong to both IO0 and IO1, and the cells 0 and 1 differ in the most significant address of the column.

In order to minimize the number of the sense amplifiers, the sense amplifiers used in 2-level state (sa1 and sa2 sense two data lines) can be employed in 4-level state. Concretely, by using control signals shown in FIG. 18, two in three sense amplifiers required for one cell in the case of 4-level state can be employed as the sense amplifiers required for one cell in the case of 2-level state. As compared with the case of 2-level state, 4-level memory cells can be read by adding one sense amplifier per 4-level cell, thereby enabling 4-level read with minimum overhead.

That is, the Flash memory shown in FIG. 18 includes first memory cells (cells belonging to IO0), second memory cells (cells belonging to IO1), first to fourth reference cells (not shown), first to sixth load current sources, first comparator (sense amplifier) sa1 to third comparator (sense amplifier) sa3 for controlling activation/inactivation conditions by control signals e1, e2 and e3, and a plurality of switching elements sw1, sw2, sw3, sw4, sw5 and sw6 which are controlled as follows.

That is, when a first mode signal be1 is a first logic "L" in 2-level mode, the first memory cells and the first load current source QL1 become a first input of the first comparator sa1, and the second memory cells and the second load current source QL2 become a first input of the second comparator sa2. Further, the first reference cell and the third load current source (not shown) become a second input of both the first and second comparators sa1 and sa2 in common, and the third comparator sa3 is inactivated.

When the first mode signal be1 is a second logic "H" in 4-level mode, the first or second memory cells are connected to the first or second load current source, whereby its connection node becomes the first input of the first to third comparators sa1 to sa3. Further, the second reference cell and the fourth load current source (not shown) become the second input of the first comparator sa1, and the third reference cell and the fifth load current source (not shown) become the second input of the second comparator sa2, and the fourth reference cell (not shown) and the sixth load current source (not shown) become the second input of the third comparator sa3.

For input and output gates connected to the cell array, the access and output of the cells IO1 to IO15 are accomplished with 16 bits in 2-level mode, while they are carried out with 8 bits in 4-level mode.

In 2-level mode, the load currents of two reference cells are on, and reference voltages v1 and v2 thus produced have a voltage "REF2 value" between data line voltages of "0", "1", respectively, thereby to output out1 and 2.

In 4-level mode, only one of data lines becomes an object for read depending upon the most significant address of the column. When CA5B is "H", all of the switching elements s1, s2 and s3 are on, whereby the data is input to the sense amplifiers sa1, sa2 and sa3, respectively. The reference voltages v1, v2 and v3 are three reference levels REF1, 2 and 3 to output out1, 2 and 3.

Thus, by switching over the data lines and the reference voltages, 2-level state can be converted into 4-level state by adding one sense amplifier per cell.

The Flash memory according to the second embodiment can be switchable from 2-level mode to 4-level mode by command or program to ROM, and the number of the sense amplifiers can be minimized by switching over both the switches for connecting the sense amplifiers to the data lines and the switches for connecting the current loads to data lines with 2-level mode or 4-level mode, respectively.

In this case, advantages as described in the first embodiment may be obtained by giving characteristics as described in the first embodiment to the reference cells.

Figure 19:
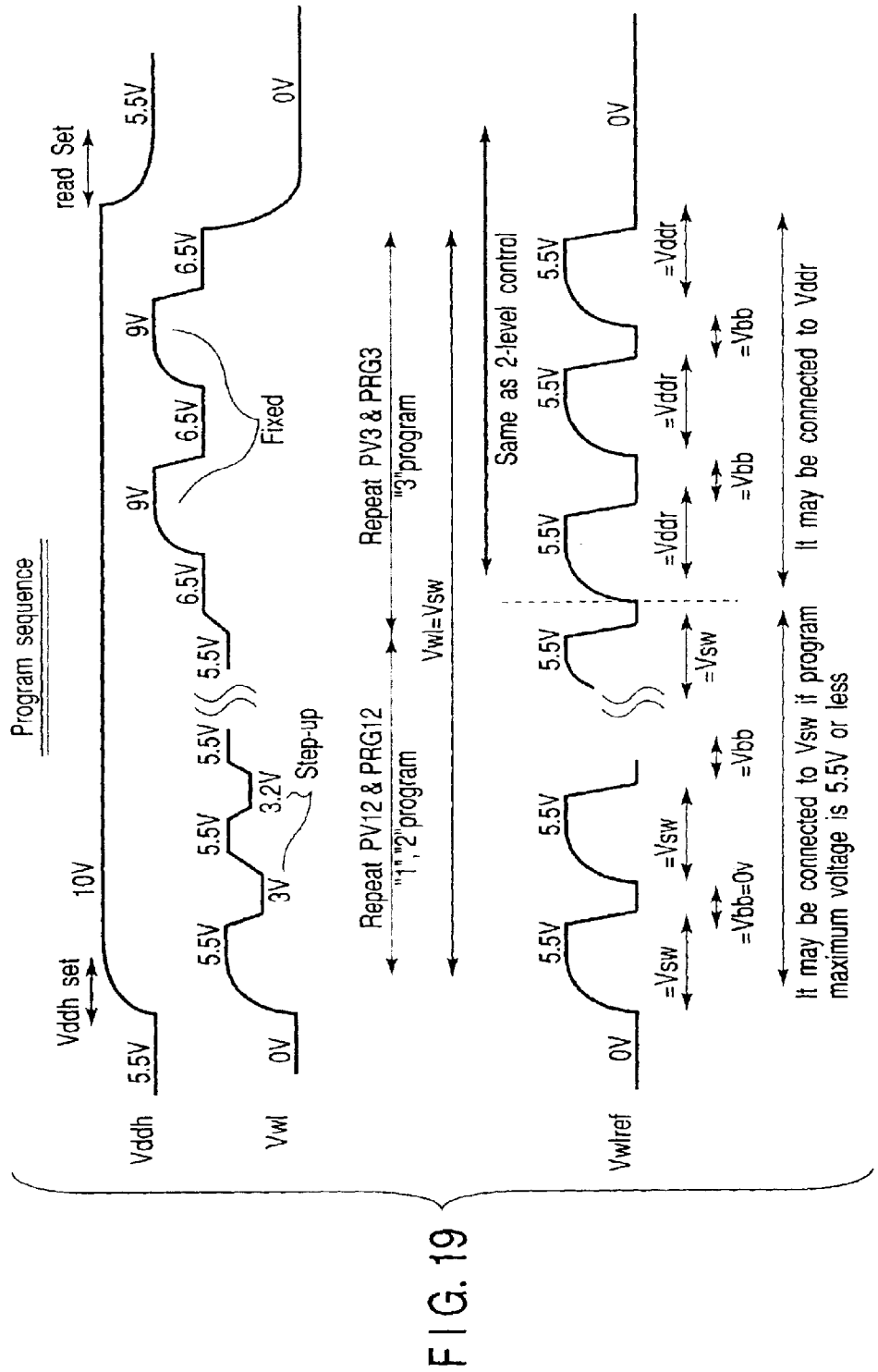
FIG. 19 is an outline of program sequence when the program of 2-level/4-level is accomplished in the 2-level/4-level switchable Flash memory according to the present invention.

FIG. 19 shows an outline of sequence when the program of 2-level/4-level is achieved in the Flash memory.

Figure 20:
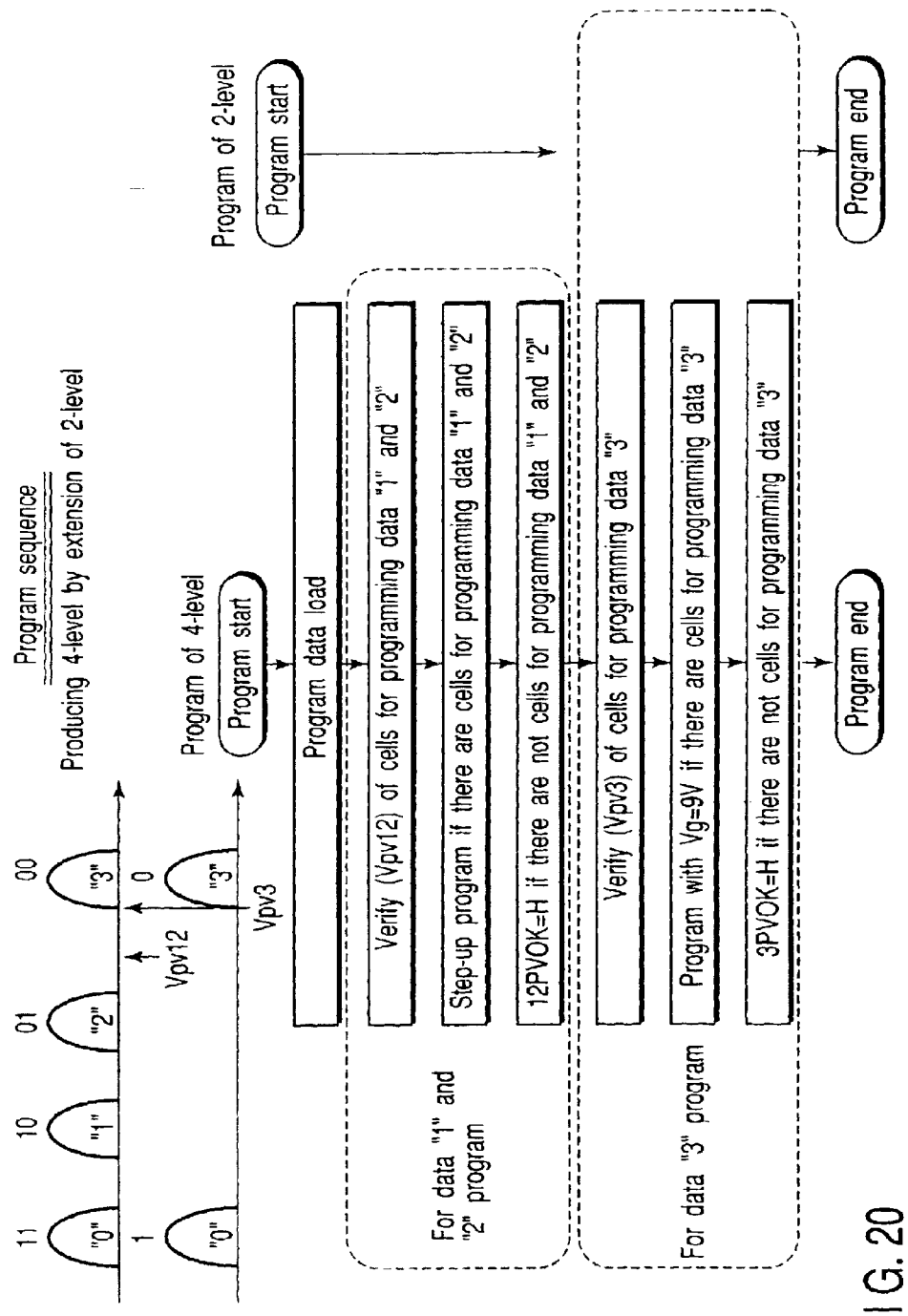
FIG. 20 is a diagram showing one example of an operational waveform corresponding to the sequence of FIG. 19.

FIG. 20 shows one example of operating waveforms corresponding to the sequence of FIG. 19.

Figure 21:
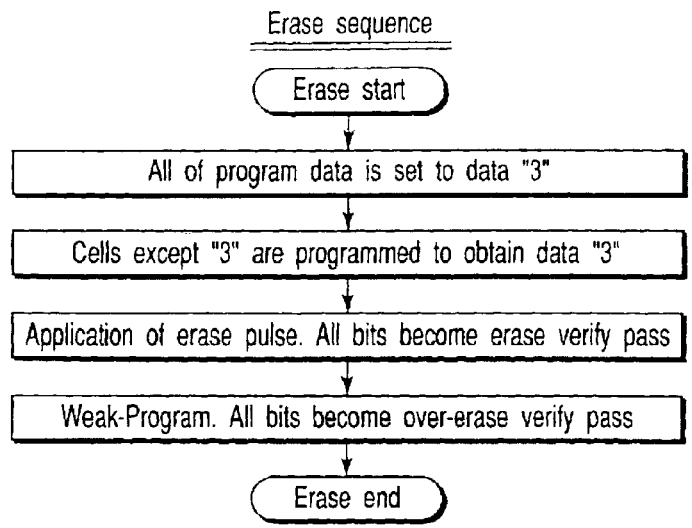
FIG. 21 is an outline of erase sequence when the erase is carried out in the 2-level/4-level switchable Flash memory according to the present invention.

FIG. 21 shows an outline of sequence when the erase is accomplished in the Flash memory.

Figure 22:
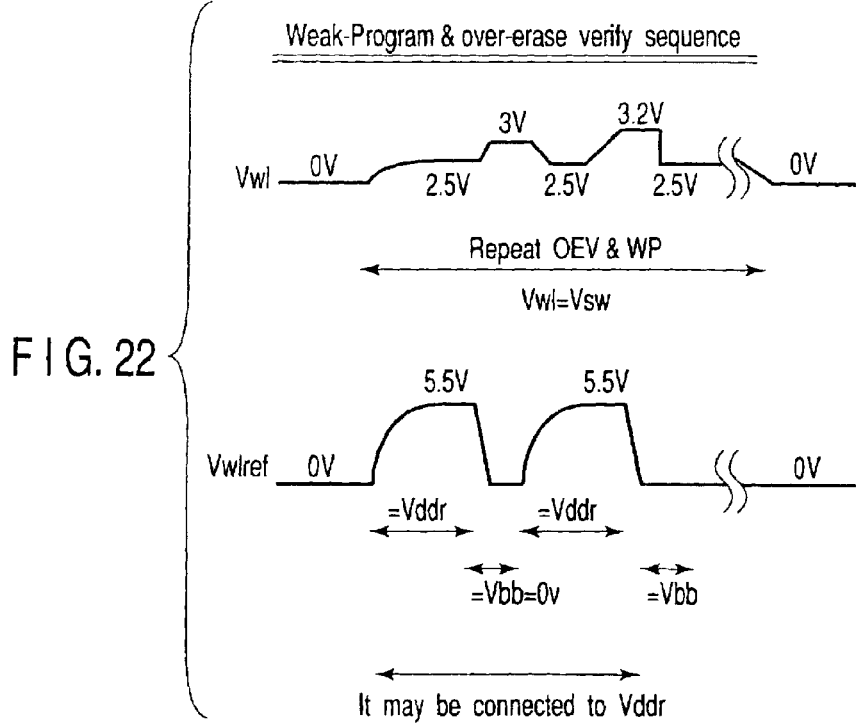
FIG. 22 is a diagram showing one example of an operational waveform corresponding to verify sequence of a weak program and an over-erase in FIG. 21.
Figure 23:
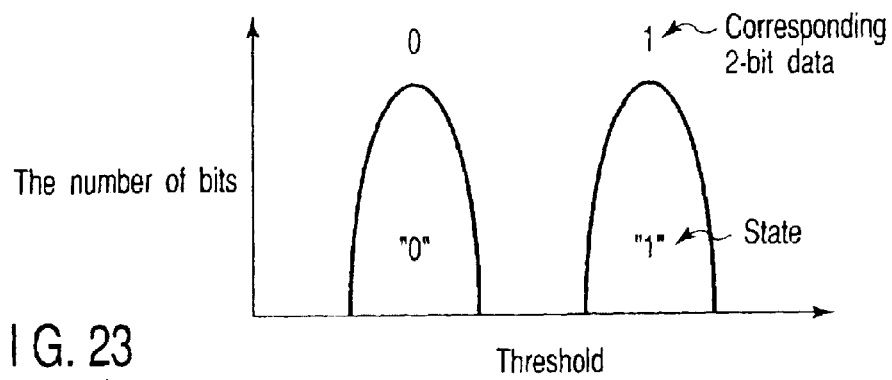
FIG. 23 is a diagram showing a distribution of threshold voltages of a Flash memory with 2-level cell array.

FIG. 22 shows one example of operating waveforms corresponding to a weak program and verify sequence of an over-erase in FIG. 21.

According to the non-volatile semiconductor memory of the present invention as described above, stability of the operation and reliability can be increased by setting the characteristics of the reference cells (current characteristics per unit load current) so as to be adapted to the temperature characteristics (current characteristics per unit load current) of each level of 4-level cells. Further, the area of the sense amplifiers for reading 4-level cells can be reduced.

What is claimed is:

1. A non-volatile semiconductor memory device comprising:
a memory cell array having a plurality of non-volatile memory cells each having three or more threshold voltage levels;
word lines, bit lines and source lines connected to said memory cells;
a row decoder configured to select one of said word lines; and
a column decoder configured to select one of said bit lines,
wherein when said three threshold voltage levels are given by Vt1, Vt2 and Vt3 (Vt1<Vt2<Vt3), respectively, the following steps (1) to (5) are executed to carry out a program operation,
(1) loading program data,
(2) programming for said memory cells to be given by the threshold voltage Vt2 being accomplished by a first gate voltage,
(3) detecting whether said memory cells have the threshold voltage Vt2, and carrying out said step (2) using a second gate voltage higher than said first gate voltage when said memory cells do not have the threshold voltage Vt2, followed by a next step (4) when said memory cells have the threshold voltage Vt2,
(4) programming for said memory cells to be given by the threshold voltage Vt3 being carried out by a third gate voltage having a value equal to or higher than a maximum value of a program gate voltage of said memory cells to be given by the threshold voltage Vt2, and
(5) detecting whether said memory cells have the threshold voltage Vt3, and re-executing said step (4) when said memory cells do not have the threshold voltage Vt3, and finishing said program operation when said memory cells have the threshold voltage Vt3.

2. A non-volatile semiconductor memory device comprising:
a memory cell array having a plurality of non-volatile memory cells each having three or more threshold voltage levels;
word lines, bit lines and source lines connected to said memory cells;
a row decoder configured to select one of said word lines; and
a column decoder configured to select one of said bit lines,
wherein when said three threshold voltage levels are given by Vt1, Vt2 and Vt3 (Vt1<Vt2<Vt3), respectively, the following steps (1) to (5) are executed to carry out a program operation,
(1) loading program data,
(2) programming for said memory cells to be given by the threshold voltage Vt3 being accomplished by a voltage value equal to or higher than a maximum value of a program gate voltage of said memory cells to be given by the threshold voltage Vt2,
(3) detecting whether said memory cells have the threshold voltage Vt3, and re-executing said step (2) when said memory cells do not have the threshold voltage Vt2, followed by a next step (4) when said memory cells have the threshold voltage Vt2,
(4) programming for said memory cells to be given by the threshold voltage Vt2 being carried out by a first gate voltage, and (5) detecting whether said memory cells have the threshold voltage Vt2, and executing said step (4) using a second gate voltage higher than said first gate voltage when said memory cells do not have the threshold voltage Vt2, while finishing said program operation when said memory cells have the threshold voltage Vt2.

3. A non-volatile semiconductor memory device comprising:

a memory cell array having a plurality of non-volatile memory cells each having four or more threshold voltage levels;

word lines, bit lines and source lines connected to said memory cells;

a row decoder configured to select one of said word lines; and a column decoder configured to select one of said bit lines, wherein when said four threshold voltage levels are given by Vt1, Vt2, Vt3 and Vt4 (Vt1<Vt2<Vt3<Vt4), respectively, the following steps (1) to (5) are executed to carry out a program operation, (1) loading program data, (2) programs for said memory cells to be given by the threshold voltage Vt2 and for said memory cells to be given by the threshold voltage Vt3 being accomplished by a first gate voltage, (3) detecting whether the threshold voltages of said memory cells have Vt2 and Vt3, respectively, and re-executing said step (2) when said memory cells do not have the threshold voltages Vt2 and Vt3, followed by a next step (4) when said memory cells have the threshold voltages Vt2 and Vt3, (4) programming for said memory cells to be given by the threshold voltage Vt4 being carried out by a voltage value equal to or higher than a maximum value of a program gate voltage of said memory cells to be given by one of Vt2 and Vt3, and (5) detecting whether said memory cells given by Vt4 have the threshold voltage of Vt4, and re-executing said step (4) when said memory cells do not have the threshold voltage Vt4, while finishing said program operation when said memory cells have the threshold voltage Vt4.

4. A non-volatile semiconductor memory device comprising:

a memory cell array having a plurality of non-volatile memory cells each having four or more threshold voltage levels;

word lines, bit lines and source lines connected to said memory cells;

a row decoder configured to select one of said word lines; and a column decoder configured to select one of said bit lines, wherein when said four threshold voltage levels are given by Vt1, Vt2, Vt3 and Vt4 (Vt1<Vt2<Vt3<Vt4), respectively, the following steps (1) to (5) are executed to carry out a program operation, (1) loading program data, (2) programming for said memory cells to be given by the threshold voltage Vt4 being accomplished by a value which is equal to or higher than a maximum value of a program gate voltage of said memory cells to be given by one of the threshold voltages Vt2 and Vt3, (3) detecting whether the threshold voltage of said memory cells to be given by the threshold voltage Vt4 have the threshold voltage Vt4, and re-executing said step (2) when said memory cells do not have the threshold voltage Vt4, followed by a next step (4) when said memory cells have the threshold voltage Vt4, (4) programming for said memory cells to be given by the threshold voltages Vt2 and Vt3 being carried out by said first gate voltage, and (5) detecting whether said memory cells given by the threshold voltages Vt2 and Vt3 have said threshold voltages of Vt2 and Vt3, respectively, and re-executing said step (2) when said memory cells do not have the threshold voltages Vt2 and Vt3, respectively, while finishing said program operation when said memory cells have the threshold voltages Vt2 and Vt3.

* * * * *